(12) United States Patent
Mahajani et al.

(10) Patent No.: US 7,798,096 B2
(45) Date of Patent: Sep. 21, 2010

(54) PLASMA, UV AND ION/NEUTRAL ASSISTED ALD OR CVD IN A BATCH TOOL

(75) Inventors: Maitreyee Mahajani, Saratoga, CA (US); Joseph Yudovsky, Campbell, CA (US); Brendan McDougall, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1116 days.

(21) Appl. No.: 11/381,970

(22) Filed: May 5, 2006

(65) Prior Publication Data

US 2007/0259110 A1 Nov. 8, 2007

(51) Int. Cl.
*C23C 16/00* (2006.01)
(52) U.S. Cl. .................................. 118/723 E
(58) Field of Classification Search ............... 118/723 E
See application file for complete search history.

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,413,022 A | 11/1983 | Suntola et al. | |
| 4,415,275 A | 11/1983 | Dietrich | |
| 4,486,487 A | 12/1984 | Skarp | |
| 4,693,208 A | 9/1987 | Sakai | |
| 4,761,269 A | 8/1988 | Conger et al. | |
| 4,834,831 A | 5/1989 | Nishizawa et al. | |
| 4,837,113 A | 6/1989 | Luttmer et al. | |
| 4,975,252 A | 12/1990 | Nishizawa et al. | |
| 4,993,357 A | 2/1991 | Scholz | |
| 5,027,746 A | 7/1991 | Frijlink | |
| 5,173,327 A | 12/1992 | Sandhu et al. | |
| 5,178,681 A | 1/1993 | Moore et al. | |
| 5,217,560 A * | 6/1993 | Kurono et al. | 156/345.43 |
| 5,225,366 A | 7/1993 | Yoder | |
| 5,261,959 A | 11/1993 | Gasworth | |
| 5,281,274 A | 1/1994 | Yoder | |
| 5,290,609 A | 3/1994 | Horiike et al. | |
| 5,294,286 A | 3/1994 | Nishizawa et al. | |
| 5,306,666 A | 4/1994 | Izumi | |
| 5,338,362 A | 8/1994 | Imahashi | |
| 5,374,570 A | 12/1994 | Nasu et al. | |
| 5,441,703 A | 8/1995 | Jurgensen | |

(Continued)

FOREIGN PATENT DOCUMENTS

CN 1481449 A 3/2004

(Continued)

OTHER PUBLICATIONS

PCT International Search Report and Written Opinion dated Oct. 29, 2007 for International Application No. PCT/US 07/68043.

(Continued)

*Primary Examiner*—Parviz Hassanzadeh
*Assistant Examiner*—Michelle Crowell
(74) *Attorney, Agent, or Firm*—Patterson & Sheridan, LLP

(57) ABSTRACT

A batch processing chamber includes a chamber housing, a substrate boat for containing a batch of substrates in a process region, and an excitation assembly for exciting species of a processing gas. The excitation assembly is positioned within the chamber housing and may include plasma, UV, or ion assistance.

32 Claims, 9 Drawing Sheets

U.S. PATENT DOCUMENTS

| | | | |
|---|---|---|---|
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,558,717 A | 9/1996 | Zhao et al. |
| 5,526,244 A | 8/1997 | Sekine et al. |
| 5,674,786 A | 10/1997 | Turner et al. |
| 5,711,811 A | 1/1998 | Suntola et al. |
| 5,730,802 A | 3/1998 | Ishizumi et al. |
| 5,796,116 A | 8/1998 | Nakata et al. |
| 5,807,792 A | 9/1998 | Ilg et al. |
| 5,834,372 A | 11/1998 | Lee |
| 5,835,677 A | 11/1998 | Li et al. |
| 5,846,332 A | 12/1998 | Zhao et al. |
| 5,855,680 A | 1/1999 | Soininen et al. |
| 5,879,459 A | 3/1999 | Gadgil et al. |
| 5,882,411 A | 3/1999 | Zhao et al. |
| 5,906,683 A | 5/1999 | Chen et al. |
| 5,916,365 A | 6/1999 | Sherman |
| 5,923,056 A | 7/1999 | Lee et al. |
| 5,972,430 A | 10/1999 | DiMeo, Jr. et al. |
| 6,001,420 A | 12/1999 | Mosely et al. |
| 6,013,553 A | 1/2000 | Wallace et al. |
| 6,015,590 A | 1/2000 | Suntola et al. |
| 6,015,917 A | 1/2000 | Bhandari et al. |
| 6,020,243 A | 2/2000 | Wallace et al. |
| 6,042,652 A | 3/2000 | Hyun et al. |
| 6,043,177 A | 3/2000 | Falconer et al. |
| 6,060,755 A | 5/2000 | Ma et al. |
| 6,071,572 A | 6/2000 | Mosely et al. |
| 6,079,356 A | 6/2000 | Umotoy et al. |
| 6,084,302 A | 7/2000 | Sandhu |
| 6,099,904 A | 8/2000 | Mak et al. |
| 6,124,158 A | 9/2000 | Dautartas et al. |
| 6,139,700 A | 10/2000 | Kang et al. |
| 6,143,082 A | 11/2000 | McInerney et al. |
| 6,143,659 A | 11/2000 | Leem |
| 6,144,060 A | 11/2000 | Park et al. |
| 6,156,382 A | 12/2000 | Rajagopalan et al. |
| 6,162,715 A | 12/2000 | Mak et al. |
| 6,174,377 B1 | 1/2001 | Doering et al. |
| 6,174,809 B1 | 1/2001 | Kang et al. |
| 6,183,563 B1 | 2/2001 | Choi et al. |
| 6,197,683 B1 | 3/2001 | Kang et al. |
| 6,200,893 B1 | 3/2001 | Sneh |
| 6,203,613 B1 | 3/2001 | Gates et al. |
| 6,206,967 B1 | 3/2001 | Mak et al. |
| 6,207,302 B1 | 3/2001 | Sugiura et al. |
| 6,207,487 B1 | 3/2001 | Kim et al. |
| 6,207,489 B1 | 3/2001 | Nam et al. |
| 6,231,672 B1 | 5/2001 | Choi et al. |
| 6,238,734 B1 | 5/2001 | Senzaki et al. |
| 6,251,190 B1 | 6/2001 | Mak et al. |
| 6,270,572 B1 | 8/2001 | Kim et al. |
| 6,284,646 B1 | 9/2001 | Leem |
| 6,287,965 B1 | 9/2001 | Kang et al. |
| 6,291,283 B1 | 9/2001 | Wilk |
| 6,291,867 B1 | 9/2001 | Wallace et al. |
| 6,297,172 B1 | 10/2001 | Kashiwagi |
| 6,297,539 B1 | 10/2001 | Ma et al. |
| 6,299,294 B1 | 10/2001 | Regan |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,309,713 B1 | 10/2001 | Mak et al. |
| 6,319,766 B1 | 11/2001 | Bakli et al. |
| 6,335,240 B1 | 1/2002 | Kim et al. |
| 6,342,277 B1 | 1/2002 | Sherman |
| 6,348,376 B2 | 2/2002 | Lim et al. |
| 6,348,386 B1 | 2/2002 | Gilmer |
| 6,358,325 B1 | 3/2002 | Andreas |
| 6,358,829 B2 | 3/2002 | Yoon et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,391,803 B1 | 5/2002 | Kim et al. |
| 6,395,650 B1 | 5/2002 | Callegari et al. |
| 6,399,208 B1 | 6/2002 | Baum et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,420,279 B1 | 7/2002 | Ono et al. |
| 6,428,859 B1 | 8/2002 | Chiang et al. |
| 6,433,314 B1 | 8/2002 | Mandrekar et al. |
| 6,447,607 B2 | 9/2002 | Soininen et al. |
| 6,451,119 B2 | 9/2002 | Sneh et al. |
| 6,451,695 B2 | 9/2002 | Sneh |
| 6,452,229 B1 | 9/2002 | Krivokapic |
| 6,454,860 B2 | 9/2002 | Metzner et al. |
| 6,458,701 B1 | 10/2002 | Chae et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,733 B2 | 11/2002 | Raaijmakers et al. |
| 6,489,214 B2 | 12/2002 | Kim et al. |
| 6,498,091 B1 | 12/2002 | Chen et al. |
| 6,511,539 B1 | 1/2003 | Raaijmakers |
| 6,524,952 B1 | 2/2003 | Srinivas et al. |
| 6,534,395 B2 | 3/2003 | Werkhoven et al. |
| 6,548,112 B1 | 4/2003 | Hillman et al. |
| 6,548,424 B2 | 4/2003 | Putkonen |
| 6,551,406 B2 | 4/2003 | Kilpi |
| 6,551,929 B1 | 4/2003 | Kori et al. |
| 6,558,509 B2 | 5/2003 | Kraus et al. |
| 6,561,498 B2 | 5/2003 | Tompkins et al. |
| 6,569,501 B2 | 5/2003 | Chiang et al. |
| 6,572,705 B1 | 6/2003 | Suntola et al. |
| 6,578,287 B2 | 6/2003 | Aswad |
| 6,579,372 B2 | 6/2003 | Park |
| 6,585,823 B1 | 7/2003 | Van Wijck |
| 6,593,484 B2 | 7/2003 | Yasuhara et al. |
| 6,596,602 B2 | 7/2003 | Iizuka et al. |
| 6,596,643 B2 | 7/2003 | Chen et al. |
| 6,599,572 B2 | 7/2003 | Saanila et al. |
| 6,607,973 B1 | 8/2003 | Jeon |
| 6,607,976 B2 | 8/2003 | Chen et al. |
| 6,613,383 B1 | 9/2003 | George et al. |
| 6,620,670 B2 | 9/2003 | Song et al. |
| 6,620,723 B1 | 9/2003 | Byun et al. |
| 6,630,030 B1 | 10/2003 | Suntola et al. |
| 6,630,201 B2 | 10/2003 | Chiang et al. |
| 6,630,413 B2 | 10/2003 | Todd |
| 6,632,279 B1 | 10/2003 | Ritala et al. |
| 6,632,747 B2 | 10/2003 | Niimi et al. |
| 6,641,673 B2 | 11/2003 | Yang |
| 6,660,126 B2 | 12/2003 | Nguyen et al. |
| 6,660,622 B2 | 12/2003 | Chen et al. |
| 6,660,659 B1 | 12/2003 | Kraus et al. |
| 6,660,660 B2 | 12/2003 | Haukka et al. |
| 6,674,138 B1 | 1/2004 | Halliyal et al. |
| 6,677,247 B2 | 1/2004 | Yuan et al. |
| 6,686,271 B2 | 2/2004 | Raaijmakers et al. |
| 6,713,177 B2 | 3/2004 | George et al. |
| 6,713,846 B1 | 3/2004 | Senzaki |
| 6,740,585 B2 | 3/2004 | Yoon et al. |
| 6,716,287 B1 | 4/2004 | Santiago et al. |
| 6,718,126 B2 | 4/2004 | Lei |
| 6,720,027 B2 | 4/2004 | Yang et al. |
| 6,734,020 B2 | 5/2004 | Lu et al. |
| 6,773,072 B2 | 8/2004 | Ganguli et al. |
| 6,773,507 B2 | 8/2004 | Jallepally et al. |

| | | | | | | |
|---|---|---|---|---|---|---|
| 6,777,352 B2 | 8/2004 | Tepman et al. | 7,294,581 B2 | 11/2007 | Iyer et al. | |
| 6,778,762 B1 | 8/2004 | Shareef et al. | 7,300,885 B2 * | 11/2007 | Hasebe et al. | 438/758 |
| 6,784,096 B2 | 8/2004 | Chen et al. | 2001/0000866 A1 | 5/2001 | Sneh et al. | |
| 6,790,755 B2 | 9/2004 | Jeon | 2001/0002280 A1 | 5/2001 | Sneh | |
| 6,790,773 B1 | 9/2004 | Drewery et al. | 2001/0009140 A1 | 7/2001 | Bondestam et al. | |
| 6,797,108 B2 | 9/2004 | Wendling | 2001/0009695 A1 | 7/2001 | Saanila et al. | |
| 6,800,173 B2 | 10/2004 | Chiang et al. | 2001/0011526 A1 | 8/2001 | Doering et al. | |
| 6,803,272 B1 | 10/2004 | Halliyal et al. | 2001/0013312 A1 | 8/2001 | Soininen et al. | |
| 6,812,157 B1 | 11/2004 | Gadgil | 2001/0014371 A1 | 8/2001 | Kilpi | |
| 6,815,285 B2 | 11/2004 | Choi et al. | 2001/0021589 A1 | 9/2001 | Wilk | |
| 6,818,094 B2 | 11/2004 | Yudovsky | 2001/0024387 A1 | 9/2001 | Raaijmakers et al. | |
| 6,821,563 B2 | 11/2004 | Yudovsky | 2001/0024871 A1 | 9/2001 | Yagi | |
| 6,825,134 B2 | 11/2004 | Law et al. | 2001/0025979 A1 | 10/2001 | Kim et al. | |
| 6,827,815 B2 | 12/2004 | Hytros et al. | 2001/0028924 A1 | 10/2001 | Sherman | |
| 6,831,004 B2 | 12/2004 | Byun et al. | 2001/0029092 A1 | 10/2001 | Park et al. | |
| 6,831,021 B2 | 12/2004 | Chua et al. | 2001/0029891 A1 | 10/2001 | Oh et al. | |
| 6,838,125 B2 | 1/2005 | Chung et al. | 2001/0034123 A1 | 10/2001 | Jeon et al. | |
| 6,841,200 B2 | 1/2005 | Kraus et al. | 2001/0041250 A1 | 11/2001 | Werkhoven | |
| 6,846,516 B2 | 1/2005 | Yang et al. | 2001/0042523 A1 | 11/2001 | Kasala | |
| 6,849,545 B2 | 2/2005 | Mak et al. | 2001/0042799 A1 | 11/2001 | Kim et al. | |
| 6,858,547 B2 | 2/2005 | Metzner et al. | 2001/0050039 A1 | 12/2001 | Park | |
| 6,866,746 B2 | 3/2005 | Lei et al. | 2001/0054377 A1 | 12/2001 | Lindfors et al. | |
| 6,868,859 B2 | 3/2005 | Yudovsky | 2001/0054730 A1 | 12/2001 | Kim et al. | |
| 6,869,838 B2 | 3/2005 | Law et al. | 2001/0054769 A1 | 12/2001 | Raaijmakers et al. | |
| 6,897,106 B2 | 3/2005 | Park et al. | 2002/0000196 A1 | 1/2002 | Park | |
| 6,875,271 B2 | 4/2005 | Glenn et al. | 2002/0000598 A1 | 1/2002 | Kang et al. | |
| 6,878,206 B2 | 4/2005 | Tzu et al. | 2002/0005168 A1 | 1/2002 | Kraus et al. | |
| 6,881,437 B2 | 4/2005 | Ivanov et al. | 2002/0005556 A1 | 1/2002 | Cartier et al. | |
| 6,893,915 B2 | 5/2005 | Park et al. | 2002/0007790 A1 | 1/2002 | Park | |
| 6,902,624 B2 | 6/2005 | Seidel et al. | 2002/0008297 A1 | 1/2002 | Park et al. | |
| 6,905,541 B2 | 6/2005 | Chen et al. | 2002/0009544 A1 | 1/2002 | McFeely et al. | |
| 6,905,737 B2 | 6/2005 | Verplancken et al. | 2002/0009896 A1 | 1/2002 | Sandhu et al. | |
| 6,911,093 B2 | 6/2005 | Stacey et al. | 2002/0014647 A1 | 2/2002 | Seidl et al. | |
| 6,911,391 B2 | 6/2005 | Yang et al. | 2002/0015790 A1 | 2/2002 | Baum et al. | |
| 6,913,827 B2 | 7/2005 | George et al. | 2002/0016084 A1 | 2/2002 | Todd | |
| 6,915,592 B2 | 7/2005 | Guenther | 2002/0017242 A1 | 2/2002 | Hamaguchi et al. | |
| 6,916,398 B2 | 7/2005 | Chen et al. | 2002/0020869 A1 | 2/2002 | Park et al. | |
| 6,921,062 B2 | 7/2005 | Gregg et al. | 2002/0021544 A1 | 2/2002 | Cho et al. | |
| 6,924,191 B2 | 8/2005 | Liu et al. | 2002/0029092 A1 | 3/2002 | Gass | |
| 6,930,060 B2 | 8/2005 | Chou et al. | 2002/0031618 A1 | 3/2002 | Sherman | |
| 6,932,871 B2 | 8/2005 | Chang et al. | 2002/0041931 A1 | 4/2002 | Suntola et al. | |
| 6,936,906 B2 | 8/2005 | Chung et al. | 2002/0043666 A1 | 4/2002 | Parsons et al. | |
| 6,939,801 B2 | 9/2005 | Chung et al. | 2002/0047151 A1 | 4/2002 | Kim et al. | |
| 6,946,033 B2 | 9/2005 | Tsuei et al. | 2002/0048635 A1 | 4/2002 | Kim et al. | |
| 6,946,399 B1 | 9/2005 | Lorimer | 2002/0052097 A1 | 5/2002 | Park | |
| 6,951,804 B2 | 10/2005 | Seutter et al. | 2002/0060363 A1 | 5/2002 | Xi et al. | |
| 6,953,742 B2 | 10/2005 | Chen et al. | 2002/0064970 A1 | 5/2002 | Chooi et al. | |
| 6,955,211 B2 | 10/2005 | Ku et al. | 2002/0066411 A1 | 6/2002 | Chiang et al. | |
| 6,958,296 B2 | 10/2005 | Chen et al. | 2002/0068458 A1 | 6/2002 | Chiang et al. | |
| 6,960,537 B2 | 11/2005 | Shero et al. | 2002/0073924 A1 | 6/2002 | Chiang et al. | |
| 6,969,539 B2 | 11/2005 | Gordon et al. | 2002/0074588 A1 | 6/2002 | Lee | |
| 6,972,267 B2 | 12/2005 | Cao et al. | 2002/0076481 A1 | 6/2002 | Chiang et al. | |
| 6,974,771 B2 | 12/2005 | Chen et al. | 2002/0076507 A1 | 6/2002 | Chiang et al. | |
| 6,983,892 B2 | 1/2006 | Noorbakhsh et al. | 2002/0076508 A1 | 6/2002 | Chiang et al. | |
| 6,994,319 B2 | 2/2006 | Yudovsky | 2002/0076837 A1 | 6/2002 | Hujanen et al. | |
| 6,998,014 B2 | 2/2006 | Chen et al. | 2002/0081826 A1 | 6/2002 | Rotondaro et al. | |
| 7,026,238 B2 | 4/2006 | Xi et al. | 2002/0081844 A1 | 6/2002 | Jeon et al. | |
| 7,041,335 B2 | 5/2006 | Chung | 2002/0086106 A1 | 7/2002 | Park et al. | |
| 7,049,226 B2 | 5/2006 | Chung et al. | 2002/0086111 A1 | 7/2002 | Byun et al. | |
| 7,066,194 B2 | 6/2006 | Ku | 2002/0086507 A1 | 7/2002 | Park et al. | |
| 7,067,439 B2 | 6/2006 | Metzner et al. | 2002/0092471 A1 | 7/2002 | Kang et al. | |
| 7,081,271 B2 | 7/2006 | Chung et al. | 2002/0093046 A1 | 7/2002 | Moriya et al. | |
| 7,085,616 B2 | 8/2006 | Chin et al. | 2002/0093781 A1 | 7/2002 | Bachhofer et al. | |
| 7,094,680 B2 | 8/2006 | Seutter et al. | 2002/0094689 A1 | 7/2002 | Park | |
| 7,094,685 B2 | 8/2006 | Yang et al. | 2002/0098627 A1 | 7/2002 | Pomarede et al. | |
| 7,175,713 B2 | 2/2007 | Thakur et al. | 2002/0104481 A1 | 8/2002 | Chiang et al. | |
| 7,186,385 B2 | 3/2007 | Ganguli et al. | 2002/0106451 A1 | 8/2002 | Skarp et al. | |
| 7,201,803 B2 | 4/2007 | Lu et al. | 2002/0106536 A1 | 8/2002 | Lee et al. | |
| 7,204,886 B2 | 4/2007 | Chen et al. | 2002/0106846 A1 | 8/2002 | Seutter et al. | |
| 7,208,413 B2 | 4/2007 | Byun et al. | 2002/0108570 A1 | 8/2002 | Lindfors | |
| 7,211,508 B2 | 5/2007 | Chung et al. | 2002/0110991 A1 | 8/2002 | Li | |
| 7,222,636 B2 | 5/2007 | Nguyen et al. | 2002/0115252 A1 | 8/2002 | Haukka et al. | |
| 7,228,873 B2 | 6/2007 | Ku et al. | 2002/0115886 A1 | 8/2002 | Yasuhara et al. | |

| | | | | | |
|---|---|---|---|---|---|
| 2002/0117399 A1 | 8/2002 | Chen et al. | 2003/0109114 A1 | 6/2003 | Niwa |
| 2002/0121241 A1 | 9/2002 | Nguyen et al. | 2003/0113187 A1 | 6/2003 | Lei et al. |
| 2002/0121342 A1 | 9/2002 | Nguyen et al. | 2003/0116087 A1 | 6/2003 | Nguyen et al. |
| 2002/0127745 A1 | 9/2002 | Lu et al. | 2003/0116804 A1 | 6/2003 | Visokay et al. |
| 2002/0134307 A1 | 9/2002 | Choi | 2003/0121469 A1 | 7/2003 | Lindfors et al. |
| 2002/0135071 A1 | 9/2002 | Kang et al. | 2003/0121608 A1 | 7/2003 | Chen et al. |
| 2002/0144655 A1 | 10/2002 | Chiang et al. | 2003/0124262 A1 | 7/2003 | Chen et al. |
| 2002/0144657 A1 | 10/2002 | Chiang et al. | 2003/0127427 A1 | 7/2003 | Yuan et al. |
| 2002/0145210 A1 | 10/2002 | Tompkins et al. | 2003/0129826 A1 | 7/2003 | Werkhoven et al. |
| 2002/0146511 A1 | 10/2002 | Chiang et al. | 2003/0133861 A1 | 7/2003 | Bowen et al. |
| 2002/0146895 A1 | 10/2002 | Ramdani | 2003/0134508 A1 | 7/2003 | Raaijmakers et al. |
| 2002/0151152 A1 | 10/2002 | Shimamoto et al. | 2003/0139005 A1 | 7/2003 | Song et al. |
| 2002/0153579 A1 | 10/2002 | Yamamoto | 2003/0140854 A1 | 7/2003 | Kilpi |
| 2002/0155722 A1 | 10/2002 | Satta et al. | 2003/0143328 A1 | 7/2003 | Chen et al. |
| 2002/0162506 A1 | 11/2002 | Sneh et al. | 2003/0143747 A1 | 7/2003 | Bondestam et al. |
| 2002/0164421 A1 | 11/2002 | Chiang et al. | 2003/0143839 A1 | 7/2003 | Raaijmakers et al. |
| 2002/0164423 A1 | 11/2002 | Chiang et al. | 2003/0143841 A1 | 7/2003 | Yang et al. |
| 2002/0172768 A1 | 11/2002 | Endo | 2003/0153177 A1 | 8/2003 | Tepman et al. |
| 2002/0173130 A1 | 11/2002 | Pomerede | 2003/0160277 A1 | 8/2003 | Bhattacharyya |
| 2002/0175393 A1 | 11/2002 | Baum | 2003/0164143 A1 * | 9/2003 | Toyoda et al. ............ 118/723 E |
| 2002/0177282 A1 | 11/2002 | Song et al. | 2003/0165615 A1 | 9/2003 | Aaltonen et al. |
| 2002/0182320 A1 | 12/2002 | Leskela et al. | 2003/0166318 A1 | 9/2003 | Zheng et al. |
| 2002/0187256 A1 | 12/2002 | Elers et al. | 2003/0167612 A1 | 9/2003 | Kraus et al. |
| 2002/0187631 A1 | 12/2002 | Kim et al. | 2003/0168750 A1 | 9/2003 | Basceri et al. |
| 2002/0195643 A1 | 12/2002 | Harada | 2003/0172872 A1 | 9/2003 | Thakur et al. |
| 2002/0196591 A1 | 12/2002 | Hujanen et al. | 2003/0173586 A1 | 9/2003 | Moriwaki et al. |
| 2002/0197402 A1 | 12/2002 | Chiang et al. | 2003/0185980 A1 | 10/2003 | Endo |
| 2002/0197863 A1 | 12/2002 | Mak et al. | 2003/0186495 A1 | 10/2003 | Saanila et al. |
| 2002/0197881 A1 | 12/2002 | Ramdani et al. | 2003/0186561 A1 | 10/2003 | Law et al. |
| 2002/0197883 A1 | 12/2002 | Niimi | 2003/0188682 A1 | 10/2003 | Tois et al. |
| 2003/0004723 A1 | 1/2003 | Chihara | 2003/0189232 A1 | 10/2003 | Law et al. |
| 2003/0010451 A1 | 1/2003 | Tzu et al. | 2003/0190423 A1 | 10/2003 | Yang et al. |
| 2003/0013300 A1 | 1/2003 | Byun | 2003/0190497 A1 | 10/2003 | Yang et al. |
| 2003/0013320 A1 | 1/2003 | Kim et al. | 2003/0190804 A1 | 10/2003 | Glenn et al. |
| 2003/0015764 A1 | 1/2003 | Raaijmakers et al. | 2003/0194493 A1 | 10/2003 | Chang et al. |
| 2003/0017697 A1 | 1/2003 | Choi et al. | 2003/0194825 A1 | 10/2003 | Law et al. |
| 2003/0022338 A1 | 1/2003 | Ruben et al. | 2003/0194853 A1 | 10/2003 | Jeon |
| 2003/0022487 A1 | 1/2003 | Yoon | 2003/0198740 A1 | 10/2003 | Wendling |
| 2003/0022507 A1 | 1/2003 | Chen et al. | 2003/0198754 A1 | 10/2003 | Xi et al. |
| 2003/0029715 A1 | 2/2003 | Yu et al. | 2003/0205729 A1 | 11/2003 | Basceri et al. |
| 2003/0031807 A1 | 2/2003 | Elers et al. | 2003/0213560 A1 | 11/2003 | Wang et al. |
| 2003/0032281 A1 | 2/2003 | Werkhoven et al. | 2003/0213987 A1 | 11/2003 | Basceri et al. |
| 2003/0038369 A1 | 2/2003 | Layadi et al. | 2003/0215570 A1 | 11/2003 | Seutter et al. |
| 2003/0042630 A1 | 3/2003 | Babcoke et al. | 2003/0216981 A1 | 11/2003 | Tillman |
| 2003/0049931 A1 | 3/2003 | Byun et al. | 2003/0219942 A1 | 11/2003 | Choi et al. |
| 2003/0049942 A1 | 3/2003 | Haukka et al. | 2003/0221780 A1 | 12/2003 | Lei et al. |
| 2003/0053799 A1 | 3/2003 | Lei | 2003/0224107 A1 | 12/2003 | Lindfors et al. |
| 2003/0054631 A1 | 3/2003 | Raaijmakers et al. | 2003/0224578 A1 | 12/2003 | Chung et al. |
| 2003/0057526 A1 | 3/2003 | Chung et al. | 2003/0224600 A1 | 12/2003 | Cao et al. |
| 2003/0057527 A1 | 3/2003 | Chung et al. | 2003/0227033 A1 | 12/2003 | Ahn et al. |
| 2003/0059535 A1 | 3/2003 | Luo et al. | 2003/0232497 A1 | 12/2003 | Xi et al. |
| 2003/0059538 A1 | 3/2003 | Chung et al. | 2003/0232501 A1 | 12/2003 | Kher et al. |
| 2003/0068437 A1 | 4/2003 | Nakamura et al. | 2003/0232506 A1 | 12/2003 | Metzner et al. |
| 2003/0072884 A1 | 4/2003 | Zhang et al. | 2003/0232511 A1 | 12/2003 | Metzner et al. |
| 2003/0072913 A1 | 4/2003 | Chou et al. | 2003/0232513 A1 | 12/2003 | Kraus et al. |
| 2003/0072975 A1 | 4/2003 | Shero et al. | 2003/0232554 A1 | 12/2003 | Blum et al. |
| 2003/0075273 A1 | 4/2003 | Kilpela et al. | 2003/0234417 A1 | 12/2003 | Raaijmakers et al. |
| 2003/0075925 A1 | 4/2003 | Lindfors et al. | 2003/0235961 A1 | 12/2003 | Metzner et al. |
| 2003/0079686 A1 | 5/2003 | Chen et al. | 2004/0005749 A1 | 1/2004 | Choi et al. |
| 2003/0082296 A1 | 5/2003 | Elers et al. | 2004/0007747 A1 | 1/2004 | Visokay et al. |
| 2003/0082300 A1 | 5/2003 | Todd et al. | 2004/0009307 A1 | 1/2004 | Koh et al. |
| 2003/0082301 A1 | 5/2003 | Chen et al. | 2004/0009336 A1 | 1/2004 | Marcadal et al. |
| 2003/0082307 A1 | 5/2003 | Chung et al. | 2004/0009675 A1 | 1/2004 | Eissa et al. |
| 2003/0087520 A1 | 5/2003 | Chen et al. | 2004/0011404 A1 | 1/2004 | Ku et al. |
| 2003/0089308 A1 | 5/2003 | Raaijmakers | 2004/0011504 A1 | 1/2004 | Ku et al. |
| 2003/0089942 A1 | 5/2003 | Bhattacharyya | 2004/0013577 A1 | 1/2004 | Ganguli et al. |
| 2003/0096473 A1 | 5/2003 | Shih et al. | 2004/0013803 A1 | 1/2004 | Chung et al. |
| 2003/0101927 A1 | 6/2003 | Raaijmakers et al. | 2004/0014320 A1 | 1/2004 | Chen et al. |
| 2003/0101938 A1 | 6/2003 | Ronsse et al. | 2004/0015300 A1 | 1/2004 | Ganguli et al. |
| 2003/0104707 A1 | 6/2003 | Senzaki et al. | 2004/0016404 A1 | 1/2004 | Gregg et al. |
| 2003/0104710 A1 | 6/2003 | Visokay et al. | 2004/0016973 A1 | 1/2004 | Rotondaro et al. |
| 2003/0106490 A1 | 6/2003 | Jallepally et al. | 2004/0018304 A1 | 1/2004 | Chung et al. |
| 2003/0108674 A1 | 6/2003 | Chung et al. | 2004/0018723 A1 | 1/2004 | Byun et al. |

| | | | | | |
|---|---|---|---|---|---|
| 2004/0018738 A1 | 1/2004 | Liu | 2005/0153571 A1 | 7/2005 | Senzaki |
| 2004/0018747 A1 | 1/2004 | Lee et al. | 2005/0164487 A1 | 7/2005 | Seutter et al. |
| 2004/0023461 A1 | 2/2004 | Ahn et al. | 2005/0173068 A1 | 8/2005 | Chen et al. |
| 2004/0023462 A1 | 2/2004 | Rotondaro et al. | 2005/0189072 A1 | 9/2005 | Chen et al. |
| 2004/0025370 A1 | 2/2004 | Guenther | 2005/0220998 A1 | 10/2005 | Chang et al. |
| 2004/0028952 A1 | 2/2004 | Cartier et al. | 2005/0229969 A1 | 10/2005 | Nguyen et al. |
| 2004/0029321 A1 | 2/2004 | Ang et al. | 2005/0233156 A1 | 10/2005 | Senzaki et al. |
| 2004/0033698 A1 | 2/2004 | Lee et al. | 2005/0252449 A1 | 11/2005 | Nguyen et al. |
| 2004/0036111 A1 | 2/2004 | Nishikawa et al. | 2005/0255243 A1 | 11/2005 | Senzaki |
| 2004/0038486 A1 | 2/2004 | Chua et al. | 2005/0255690 A1 | 11/2005 | Chen et al. |
| 2004/0038554 A1 | 2/2004 | Ahn et al. | 2005/0257735 A1 | 11/2005 | Guenther et al. |
| 2004/0040501 A1 | 3/2004 | Vaartstra | 2005/0260347 A1 | 11/2005 | Narwankar et al. |
| 2004/0043149 A1 | 3/2004 | Gordon et al. | 2005/0260357 A1 | 11/2005 | Olsen et al. |
| 2004/0043569 A1 | 3/2004 | Ahn et al. | 2005/0266682 A1 | 12/2005 | Chen et al. |
| 2004/0043623 A1 | 3/2004 | Liu et al. | 2005/0271812 A1 | 12/2005 | Myo et al. |
| 2004/0043630 A1 | 3/2004 | Vaartstra et al. | 2005/0271813 A1 | 12/2005 | Kher et al. |
| 2004/0048461 A1 | 3/2004 | Chen et al. | 2005/0271814 A1 | 12/2005 | Chang et al. |
| 2004/0051152 A1 | 3/2004 | Nakajima | 2005/0277290 A1 | 12/2005 | Yang et al. |
| 2004/0053484 A1 | 3/2004 | Kumar et al. | 2006/0018639 A1 | 1/2006 | Ramamurthy et al. |
| 2004/0065255 A1 | 4/2004 | Yang et al. | 2006/0019032 A1 | 1/2006 | Wang et al. |
| 2004/0067641 A1 | 4/2004 | Yudovsky | 2006/0019033 A1 | 1/2006 | Muthukrishnan et al. |
| 2004/0069227 A1 | 4/2004 | Ku et al. | 2006/0019494 A1 | 1/2006 | Cao et al. |
| 2004/0071897 A1 | 4/2004 | Verplancken et al. | 2006/0019495 A1 | 1/2006 | Marcadal et al. |
| 2004/0077182 A1 | 4/2004 | Lim | 2006/0030148 A1 | 2/2006 | Seutter et al. |
| 2004/0077183 A1 | 4/2004 | Chung et al. | 2006/0035025 A1 | 2/2006 | Verplancken et al. |
| 2004/0105934 A1 | 6/2004 | Chang et al. | 2006/0057843 A1 | 3/2006 | Chen et al. |
| 2004/0121085 A1 | 6/2004 | Wang et al. | 2006/0062917 A1 | 3/2006 | Muthukrishnan et al. |
| 2004/0143370 A1 | 7/2004 | Lu et al. | 2006/0075966 A1 | 4/2006 | Chen et al. |
| 2004/0144308 A1 | 7/2004 | Yudovsky | 2006/0084283 A1 | 4/2006 | Paranjpe et al. |
| 2004/0144309 A1 | 7/2004 | Yudovsky | 2006/0128150 A1 | 6/2006 | Gandikota et al. |
| 2004/0144311 A1 | 7/2004 | Chen et al. | 2006/0148253 A1 | 7/2006 | Chung et al. |
| 2004/0144431 A1 | 7/2004 | Yudovsky | 2006/0153973 A1 | 7/2006 | Chang et al. |
| 2004/0157391 A1 | 8/2004 | Park et al. | 2006/0153995 A1 | 7/2006 | Narwankar et al. |
| 2004/0170403 A1 | 9/2004 | Lei | 2006/0156979 A1 | 7/2006 | Thakur et al. |
| 2004/0175961 A1 | 9/2004 | Olsen | 2006/0178018 A1 | 8/2006 | Olsen |
| 2004/0187304 A1 | 9/2004 | Chen et al. | 2006/0199372 A1 | 9/2006 | Chung et al. |
| 2004/0194691 A1 | 10/2004 | George et al. | 2006/0208215 A1 | 9/2006 | Metzner et al. |
| 2004/0197492 A1 | 10/2004 | Chen et al. | 2006/0213557 A1 | 9/2006 | Ku et al. |
| 2004/0198069 A1 | 10/2004 | Metzner et al. | 2006/0213558 A1 | 9/2006 | Ku et al. |
| 2004/0203254 A1 | 10/2004 | Conley, Jr. et al. | 2006/0216928 A1 | 9/2006 | Chung et al. |
| 2004/0209460 A1 | 10/2004 | Xi et al. | 2006/0223286 A1 | 10/2006 | Chin et al. |
| 2004/0211665 A1 | 10/2004 | Yoon et al. | 2006/0223339 A1 | 10/2006 | Metzner et al. |
| 2004/0214354 A1 | 10/2004 | Conley, Jr. et al. | 2006/0257295 A1 | 11/2006 | Chen et al. |
| 2004/0216670 A1 | 11/2004 | Gutsche et al. | 2006/0264067 A1 | 11/2006 | Kher et al. |
| 2004/0219784 A1 | 11/2004 | Kang et al. | 2006/0276020 A1 | 12/2006 | Yoon et al. |
| 2004/0224089 A1 | 11/2004 | Singh et al. | 2006/0286774 A1 | 12/2006 | Singh et al. |
| 2004/0224504 A1 | 11/2004 | Gadgil | 2006/0286775 A1 | 12/2006 | Singh et al. |
| 2004/0224506 A1 | 11/2004 | Choi et al. | 2006/0286776 A1 | 12/2006 | Ranish et al. |
| 2004/0235285 A1 | 11/2004 | Kang et al. | 2006/0286818 A1 | 12/2006 | Wang et al. |
| 2004/0241321 A1 | 12/2004 | Ganguli et al. | 2006/0286819 A1 | 12/2006 | Seutter et al. |
| 2004/0253375 A1 | 12/2004 | Ivanov et al. | 2006/0286820 A1 | 12/2006 | Singh et al. |
| 2004/0256351 A1 | 12/2004 | Chung et al. | 2006/0292864 A1 | 12/2006 | Yang et al. |
| 2004/0256664 A1 | 12/2004 | Chou et al. | 2007/0003698 A1 | 1/2007 | Chen et al. |
| 2004/0266175 A1 | 12/2004 | Chen et al. | 2007/0018244 A1 | 1/2007 | Hung et al. |
| 2005/0006799 A1 | 1/2005 | Gregg et al. | 2007/0020890 A1 | 1/2007 | Thakur et al. |
| 2005/0008779 A1 | 1/2005 | Yang et al. | 2007/0026147 A1 | 2/2007 | Chen et al. |
| 2005/0009325 A1 | 1/2005 | Chung et al. | 2007/0049043 A1 | 3/2007 | Muthukrishnan et al. |
| 2005/0009371 A1 | 1/2005 | Metzner et al. | 2007/0049053 A1 | 3/2007 | Mahajani et al. |
| 2005/0012975 A1 | 1/2005 | George et al. | 2007/0059948 A1 | 3/2007 | Metzner et al. |
| 2005/0016956 A1 | 1/2005 | Liu et al. | 2007/0065578 A1 | 3/2007 | McDougall |
| 2005/0037627 A1 | 2/2005 | Dussarrat et al. | 2007/0067609 A1 | 3/2007 | Chen et al. |
| 2005/0059240 A1 | 3/2005 | Choi et al. | 2007/0079759 A1 | 4/2007 | Lee et al. |
| 2005/0064207 A1 | 3/2005 | Senzaki et al. | 2007/0095285 A1 | 5/2007 | Thakur et al. |
| 2005/0070126 A1 | 3/2005 | Senzaki | 2007/0099415 A1 | 5/2007 | Chen et al. |
| 2005/0074968 A1 | 4/2005 | Chen et al. | | | |
| 2005/0095859 A1 | 5/2005 | Chen et al. | | | |
| 2005/0104142 A1 | 5/2005 | Narayanan et al. | | FOREIGN PATENT DOCUMENTS | |
| 2005/0106865 A1 | 5/2005 | Chung et al. | EP | 0 497 267 | 1/1991 |
| 2005/0115675 A1 | 6/2005 | Tzu et al. | EP | 0 464 515 | 1/1992 |
| 2005/0118804 A1 | 6/2005 | Byun et al. | EP | 0 973 189 | 1/2000 |
| 2005/0130438 A1 | 6/2005 | Rotondaro et al. | EP | 0 973 191 | 1/2000 |
| 2005/0139160 A1 | 6/2005 | Lei et al. | EP | 1 146 141 | 10/2001 |
| 2005/0139948 A1 | 6/2005 | Chung et al. | EP | 1 167 569 | 1/2002 |

| | | |
|---|---|---|
| EP | 1 170 804 | 1/2002 |
| EP | 1 321 973 | 6/2003 |
| GB | 2 355 727 | 5/2001 |
| JP | 58-098917 | 6/1983 |
| JP | 64-082671 | 3/1989 |
| JP | 01-143221 | 6/1989 |
| JP | 02-014513 | 1/1990 |
| JP | 02-230690 | 9/1990 |
| JP | 02-246161 | 9/1990 |
| JP | 03-234025 | 10/1991 |
| JP | 04-291916 | 9/1992 |
| JP | 05-029228 | 2/1993 |
| JP | 05-074724 | 3/1993 |
| JP | 05-206036 | 8/1993 |
| JP | 05-234899 | 9/1993 |
| JP | 05-270997 | 10/1993 |
| JP | 06-224138 | 5/1994 |
| JP | 06-177381 | 6/1994 |
| JP | 06-230421 | 8/1994 |
| JP | 07-086269 | 3/1995 |
| JP | 07-300649 | 11/1995 |
| JP | 05-047666 | 2/1996 |
| JP | 11-269652 | 10/1999 |
| JP | 2000-031387 | 1/2000 |
| JP | 2000-058777 | 2/2000 |
| JP | 2000-319772 | 11/2000 |
| JP | 2001-020075 | 1/2001 |
| JP | 10-308283 | 3/2001 |
| JP | 2001-111000 | 4/2001 |
| JP | 2001-220294 | 8/2001 |
| JP | 2001-254181 | 9/2001 |
| JP | 2001-328900 | 11/2001 |
| JP | 2002-060944 | 2/2002 |
| JP | 2002-069641 | 3/2002 |
| JP | 2002-093804 | 3/2002 |
| JP | 2001-172767 | 6/2002 |
| JP | 2002-167672 | 6/2002 |
| JP | 2000-212752 | 11/2002 |
| WO | WO 96/17107 | 6/1996 |
| WO | WO 99/01595 | 1/1999 |
| WO | WO 99/29924 | 6/1999 |
| WO | WO 99/65064 | 12/1999 |
| WO | WO 00/13235 | 3/2000 |
| WO | WO 00/15865 | 3/2000 |
| WO | WO 00/16377 | 3/2000 |
| WO | WO 01/15220 | 3/2000 |
| WO | WO 00/54320 | 9/2000 |
| WO | WO 00/63957 | 10/2000 |
| WO | WO 00/70674 | 11/2000 |
| WO | WO 00/79576 | 12/2000 |
| WO | WO 01/17692 | 3/2001 |
| WO | WO 01/25502 | 4/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/40541 | 6/2001 |
| WO | WO 01/66832 | 9/2001 |
| WO | WO 01/82390 | 11/2001 |
| WO | WO 01/99166 | 12/2001 |
| WO | WO 02/01628 | 1/2002 |
| WO | WO 02/08485 | 1/2002 |
| WO | WO 02/08488 | 1/2002 |
| WO | WO 02/09167 | 1/2002 |
| WO | WO 02/27063 | 4/2002 |
| WO | WO 02/31875 | 4/2002 |
| WO | WO 02/43115 | 5/2002 |
| WO | WO 02/45167 | 6/2002 |
| WO | WO 02/45871 | 6/2002 |
| WO | WO 02/46489 | 6/2002 |
| WO | WO-02/50355 | 6/2002 |
| WO | WO 02/065525 | 8/2002 |
| WO | WO 02/067319 | 8/2002 |
| WO | WO 03/023835 | 3/2003 |
| WO | WO 2004/008491 | 1/2004 |
| WO | WO 2004/010471 | 1/2004 |
| WO | WO 2004/106584 | 12/2004 |

OTHER PUBLICATIONS

Argarwal, et al. "Challenges in Integrating the High-K Gate Dielectric Film to the Conventional CMOS Process Flow," Mat. Sec. Soc. Sump. Proc. vol. 670 (2001).

Balog, et al. "Chemical Vapor Deposition and Characterization of HfO2 Films from Organo-Hafnium Compounds," Thin Solid Films, 41 (1977) 247-259.

Cameron, et al. "Atomic Layer Deposition of $SiO_2$ and $TiO_2$ in Alumina Tubular Membranes," Langmuir, vol. 16, No. 19, American Chemical Society, 2000 pp. 7435-7444.

Chatham, Hood; et al. "Nitridation of Hafnium Silicate Thin Films", Mat. Res. Soc. Symp. Proc. vol. 811, Apr. 12-16, 2004, D7.5.1.

Cheon, et al. "Gas Phase Photoproduction of Diatomic Metal Nitrides During Metal Nitride Laser Chemical Vapor Deposition," Inorg. Chem. 1999, 38, 2238-2239.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Conley, J.F.; et al. "Interval Annealing During Alternating Pulse Deposition", Mat. Res. Soc. Symp. Proc. vol. 811, Apr. 12-16, 2004, D1.3.1.

Dey, et al. "Ruthenium films by digital chemical vapor deposition: Selectivity, nanostructure, and work function," Applied Physics Letter, vol. 84, No. 9, Mar. 1, 2004, American Institute of Physics, pp. 1606.

Eisenbraum, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

Ferguson, et al. "Atomic Layer Deposition of Al2O3 and SiO2 on BN Particles Using Sequential Surface Reactions," Applied Surface Science, 162-163, (2000), pp. 280-292.

George, et al. "Atomic Layer Controlled Deposition of SiO2 and Al2O3 using ABAB . . . binary reaction sequence chemistry," Applied Surface Science 82/83 (1994) 460-467.

George, et al. "Surface Chemistry for Atomic Layer Growth," J. Phys. Chem. (1996), 100, 13121-13131.

Goswami, et al. Transition Metals Show Promise as Copper Barriers, Semiconductor International, ATMI, San Jose—May 1, 2004.

Goto, et al. "Atomic layer controlled deposition of silicon nitride with self-limiting mechanism," Applied Physics Letters, American Institute of Physics. New York, US, vol. 68, No. 23, Jun. 3, 1996, pp. 3257-3259.

Groner, et al. "High-k Dielectrics Grown by Atomic Layer Deposition: Capacitor and Gate Applications," Interlayer Dielectrics for Semiconductor Technologies, Chapter 10, Elsevier Inc., 2003, pp. 327-348.

Hausmann, et al. "Rapid Vapor Deposition of Highly Conformal Silica Nanolaminates," Science, vol. 298, Oct. 11, 2002, pp. 402-406.

He, et al. "Pulsed Deposition of Silicate Films," Journal of Applied Physics, vol. 94, No. 5, Sep. 1, 2003, pp. 3657-3659.

Hendrix, et al. "Composition control of Hf1-xSixO2 films deposited on Si by chemical-vapor deposition using amide precursors," Applied Physics Letters, American Institute of Physics. New York, US, vol. 80, No. 13, Apr. 1, 2002, pp. 2362-2364.

Ho, et al. "Suppressed crystallization of Hf-based gate dielectrics by controlled addition of Al2O3 using atomic layer deposition", Applied Physics Letters, American Institute of Physics, New York, US, vol. 81, No. 22, Nov. 25, 2002, pp. 4218-4220.

Hong, et al. "Characteristics of PAALD-TaN thin films derived from TAIMATA precursor for copper metallization", Internconnect Technology Conference, 2004. Proceedings of the IEEE 2004 International, Jun. 7-9, 2004, pp. 9-11.

Hwang, et al. "Nanometer-Size α-PbO2-type TiO2 in Garnet: A Thermobarometer for Ultrahigh-Pressure Metamorphism," Science vol. 288 (Apr. 14, 2000).

Jeong, et al. "Growth and Characterization of Aluminum Oxide (Al2O3) Thin Films by Plasma-Assisted Atomic Layer Controlled Deposition," J. Korean Inst. Met. Mater., vol. 38, No. 10, Oct. 2000 pp. 1395-1399.

Jeong, et al. "Plasma-assisted Atomic Layer Growth of High-Quality Aluminum Oxide Thin Films," Jpn. J. Appl. Phys. 1, vol. 40, No. 1, Jan. 2001 pp. 285-289.

Kamiyama, et al. "Improvement in the uniformity and the thermal stability of Hf-silicate gate dielectric by plasma-nitridation," Gate Insulator, 2003. IWGI 2003. Extended Abstracts of International Workshop on Nov. 6-7, 2003, Piscataway, NJ, USA, IEEE, Nov. 6, 2002, pp. 42-46.

Kang, et al. "Infrared Spectroscopic Study of Atomic Layer Deposition Mechanism for Hafnium Silicate Thin Films Using HfCl2 [N(SiMe3) 2]2 and H2O," J. Vac. Sci. Technol. A 22(6), Nov./Dec. 2004, American Vacuum Society, pp. 2393-2397.

Kattelus, et al. "Electrical Properties of Tantalum Based Composite Oxide Films," Mat. Res. Soc. Symp. Proc., 284 (1993) 511-516.

Kawahara, et al. "Effects of Hf sources, oxidizing agents, and NH3 radicals on properties of HfAlOx films prepared by atomic layer deposition", IWGI 2003, Tokyo, Nov. 6, 2003, pp. 32-37.

Kim, et al. "Substrate dependence on the optical properties of Al2O3 films grown by atomic layer deposition," Applied. Phys. Lett. 71 (25), Dec. 22, 1997 (3604-6).

Klaus, et al. "Atomic Layer Deposition of SiO2 Using Catalyzed and Uncatalyzed Self-Limiting Surface Reactions," Surface Review and Letters, vol. 6, Nos. 3 & 4 (1999) 435-448.

Kukli, et al. "Atomic Layer Deposition of Hafnium Dioxide Films from Hafnium Tetrakis(ethylmethylamide) and Water", Chemical Vapor Deposition, VCH Publishers, Weinheim, DE, vol. 8, No. 5, Sep. 2002, pp. 199-204.

Kukli, et al. "Atomic Layer Epitaxy Growth of Tantalum Oxide Thin Films from Ta(OC2H5)5 and H2O," Journal of the Electrochemical Society, vol. 142, No. 5, May 1995; p. 1670-5.

Kukli, et al. "In situ Study of Atomic Layer Epitaxy Growth of Tantalum Oxide Thin Films From Ta(OC2H5)5 and H2O," Applied Surface Science, vol. 112, Mar. 1997, p. 236-42.

Kukli, et al. "Properties of (Nb1-xTax)2O5 Solid Solutions and (Nb1-xTax)2O5-ZrO2 Nanolaminates Grown by Atomic Layer Epitaxy," 1997; p. 785-93.

Kukli, et al. "Properties of Ta2O5-Based Dielectric Nanolaminates Deposited by Atomic Layer Epitaxy," Journal of the Electrochemical Society, vol. 144, No. 1, Jan. 1997; p. 300-6.

Kukli, et al. "Tailoring the Dielectric Properties of HfO2-Ta2O5 Nanolaminates," Applied Physics Letters, vol. 68, No. 26 (Jun. 24, 1996), pp. 3737-3739.

Lee, et al. "Cyclic Technique for the Enhancement of Highly Oriented Diamond Film Growth," Thin Solid Films 303 (1997) pp. 264-269.

Martensson, et al. "Use of Atomic Layer Epitaxy for Fabrication of Si/TiN/Cu Structures," J. Vac. Sci. & Tech. B, vol. 17, No. 5, (Sep. 1999) pp. 2122-2128.

Min, et al. "Atomic Layer Deposition of TiN Thin Films by Sequential Introduction of Ti Precursor and NH3," Mat. Res. Soc. Symp. Proc. vol. 514 (1998).

Min, et al. "Chemical Vapor Deposition of Ti-Si-N Films With Alternating Source Supply," Mat. Rec. Soc. Symp. Proc. vol. (1999).

Min, et al. "Metal-organic Atomic-layer Deposition of Titanium-silicon-nitride Films," Applied Physics Letters, vol. 75, No. 11 (Sep. 11, 1999) pp. 1521-1523.

Niinisto, et al. "Synthesis of Oxide Thin Films and Overlayers by Atomic Layer Epitaxy for Advanced Applications," Materials Science and Engineering B41 (1996) 23-29.

Ohshita, et al. "Hf1-xSixO2 deposition by metal organic chemical vapor deposition using the Hf(NEt2)4/SiH(NEt2)3/O2 gas system", Preparation and Characterization, Elsevier Sequioa, NL, vol. 416, No. 1-2, Sep. 2, 2002, pp. 208-211.

Ohshita, et al. "HfO2 Growth by Low-pressure Chemical Vapor Deposition Using the Hf(N(C2H5)2)4/O2 Gas System," Journal of Crystal Growth 233 (2001) 292-297.

Paranjpe, et al. "Atomic Layer Deposition of AlO3 for Thin Film Head Gap Applications," J. Elec. Soc., vol. 148, No. 9 Sep. 2001 pp. G465-471.

Park, et al. "Performance improvement of MOSFET with HfO2-Al2O3 laminate gate dielectric and CVD-TaN metal gate deposited by TAIMATA", Electron Devices Meeting, 2003. IEDM '03 Techinical Digest. IEEE International Dec. 8-10, 2003, pp. 13.6.1-13.6.4.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Deposition of Oxide Thin Films with Metal Alkoxides as Oxygen Sources," Science vol. 288 Apr. 14, 2000.

Ritala, et al. "Atomic Layer Epitaxy Growth of TiN Thin Films From Til4 and NH3," J. Electrochem. Soc., vol. 145, No. 8 (Aug. 1998) pp. 2914-2920.

Ritala, et al. "Atomic Layer Epitaxy Growth of TiN Thin Films," J. Electrochem. Soc., vol. 142, No. 8, Aug. 1995.

Ritala, et al. "Development of Crystallinity and Morphology in Hafnium Dioxide Thin Films Grown by Atomic Layer Epitaxy," Thin Solid Films, vol. 250, No. 1-2, (Oct. 1, 1994), p. 72-80.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and Al2O3 Films Deposited by Atomic Layer Deposition," Chemical Vapor Deposition, Jan. 1999, 5, No. 1, pp. 6-9.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Ritala, et al. Ann. Acad. Sci. Fenn. Ser. A II. Chemica 257 (1994) 1-48.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.

Senzaki, et al. "A Novel Atomic Layer Deposition Process to Deposit Hafnium Silicate Thin Films", Electrochemical Society Proceedings vol. 2004-01, pp. 264-270.

Shenai, et al. "Correlation of vapor pressure equation and film properties with trimethylindium purity for the MOVPE grown III-V compounds," Journal of Crystal Growth 248 (2003) pp. 91-98.

Visokay, et al. "Application of HfSiON as a gate dielectric material", Applied Physics Letter, American Institute of Physics, New York, US, vol. 80, No. 17, Apr. 29, 2002, pp. 3183-3185.

First Office Action issued Nov. 13, 2009 in Chinese Application No. 200780016253.6 (APPM/010749CNP).

USPTO Office Action Dated Dec. 17, 2009, in U.S. Appl. No. 11/464,121 (APPM/010749.P1).

* cited by examiner

PLASMA, UV AND ION/NEUTRAL ASSISTED ALD OR CVD IN A BATCH TOOL

CROSS-REFERENCE TO RELATED APPLICATIONS

This application is related to U.S. patent application Ser. No. 11/464,121, filed on Aug. 11, 2006, and published as United States Patent Application Publication 2007/0259111 on Nov. 8, 2007.

BACKGROUND OF THE INVENTION

1. Field of the Invention

Embodiments of the invention generally relate to an apparatus and a method used during a batch deposition process, and more specifically, embodiments relate to a batch processing chamber and a batch processing method for depositing a material using a processing gas having excited species.

2. Description of the Related Art

A substrate fabrication process is often evaluated by two related and important factors, which are device yield and the cost of ownership (COO). The COO, while affected by a number of factors, is greatly affected by the number of substrates processed per time, i.e., the throughput of the fabrication process, and cost of processing materials. Batch processing has been found to be promising in the attempt to increase throughput. However, providing processing conditions uniformly over an increased number of substrates is a challenging task.

In addition, plasma assisted ALD or CVD processes, UV assisted (photo-assisted) ALD or CVD processes, and ALD or CVD processes having assistance directly by ions provided to a processing area have been shown to be beneficial to some deposition processes. For example, UV and plasma assisted processes have been demonstrated to provide good film quality for high-k dielectrics which are increasingly needed as device scale approaches sub 65 nm applications. Plasma assisted ALD or CVD have also been demonstrated to reduce thermal budget and process time requirements as compared to similar thermally assisted processes.

Providing uniform process conditions over an increased number of substrates is even more challenging if additional assisting treatments are added to the processes as described above for plasma assisted ALD or CVD processes, UV assisted (photo-assisted) ALD or CVD processes, and ALD or CVD processes having assistance directly by ions provided to a processing area.

Plasma assisted ALD processes have used remote plasma generation to attempt exposing substrates to uniform plasma conditions within a batch chamber. The plasma is introduced through a delivery system such as the gas delivery system of the batch tool. However, this process may suffer from the relaxation of the plasma prior to entering the process region.

Therefore, there is a need for an apparatus and a method for uniformly and effectively depositing materials during ALD or CVD processes in a batch tool with plasma assistance, UV assistance, or ion assistance.

SUMMARY OF THE INVENTION

The invention generally provides a batch processing apparatus in which a plurality of substrates is processed in parallel. The apparatus includes an assembly for exciting species of the one or more processing gases used for processing the substrates by a plasma assistance, a UV assistance and/or an ion assistance. Embodiments of the invention generally provide methods of the assisted processes and apparatuses, in which the assisted processes may be conducted for providing uniformly deposited material.

According to one embodiment, a batch processing chamber is provided which includes a chamber housing of the batch chamber, a substrate boat for containing a batch of substrates in a process region, and an excitation assembly for exciting species of a processing gas. The excitation assembly is positioned within the chamber housing.

According to another embodiment, a method for batch processing of substrates is provided which includes processing a batch of substrates vertically stacked in a substrate boat positioned within a chamber, injecting processing gases into a process region within the chamber, and assisting the processing by exciting species of the processing gas within the chamber.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The invention generally provides an apparatus and a method for processing semiconductor substrates in a batch with assemblies for assisting the processes by generated ions. In one embodiment of the invention, a batch processing chamber with an excitation assembly, which is positioned within the batch processing chamber housing, is provided. An example of a batch processing chamber which may be useful for one embodiment described herein is a FLEXSTAR® system, available from Applied Materials, Inc., located in Santa Clara, Calif.

Generally, excited species of processing gases may be generated to assist the ALD or CVD processes as described herein. These species may be excited by plasma assistance, UV assistance (photo assistance), ion assistance (e.g., ions generated by an ion source), or combinations thereof. The species are excited in or in the vicinity of the process region within the chamber housing to avoid relaxation of the excited states before the ions reach the process region of the batch processing chamber.

A "substrate" as referred to herein, includes, but is not limited to, semiconductor wafers, semiconductor workpieces, and other workpieces such as optical planks, memory disks and the like. Embodiments of the invention may be applied to any generally flat workpiece on which material is deposited by the methods described herein.

"Vertical direction" and "horizontal direction" are to be understood as indicating relative directions. Thus, the horizontal direction is to be understood as substantially perpendicular to the vertical direction and vice versa. Nevertheless, it is within the scope of the invention that the described embodiments and aspects may be rotated in its entirety such that the dimension referred to as the vertical direction is oriented horizontally and, at the same time, the dimension referred to as the horizontal direction is oriented vertically.

A batch processing chamber for ALD or CVD processing useful for embodiments described herein is described in commonly assigned U.S. Ser. No. 11/249,555, entitled "Reaction Chamber with Opposing Pockets for Gas Injection and Exhaust," filed Oct. 13, 2005, which is incorporated herein by reference for providing further description of a chamber, a heating system, a gas delivery system, and an exhaust system.

Figure 1:
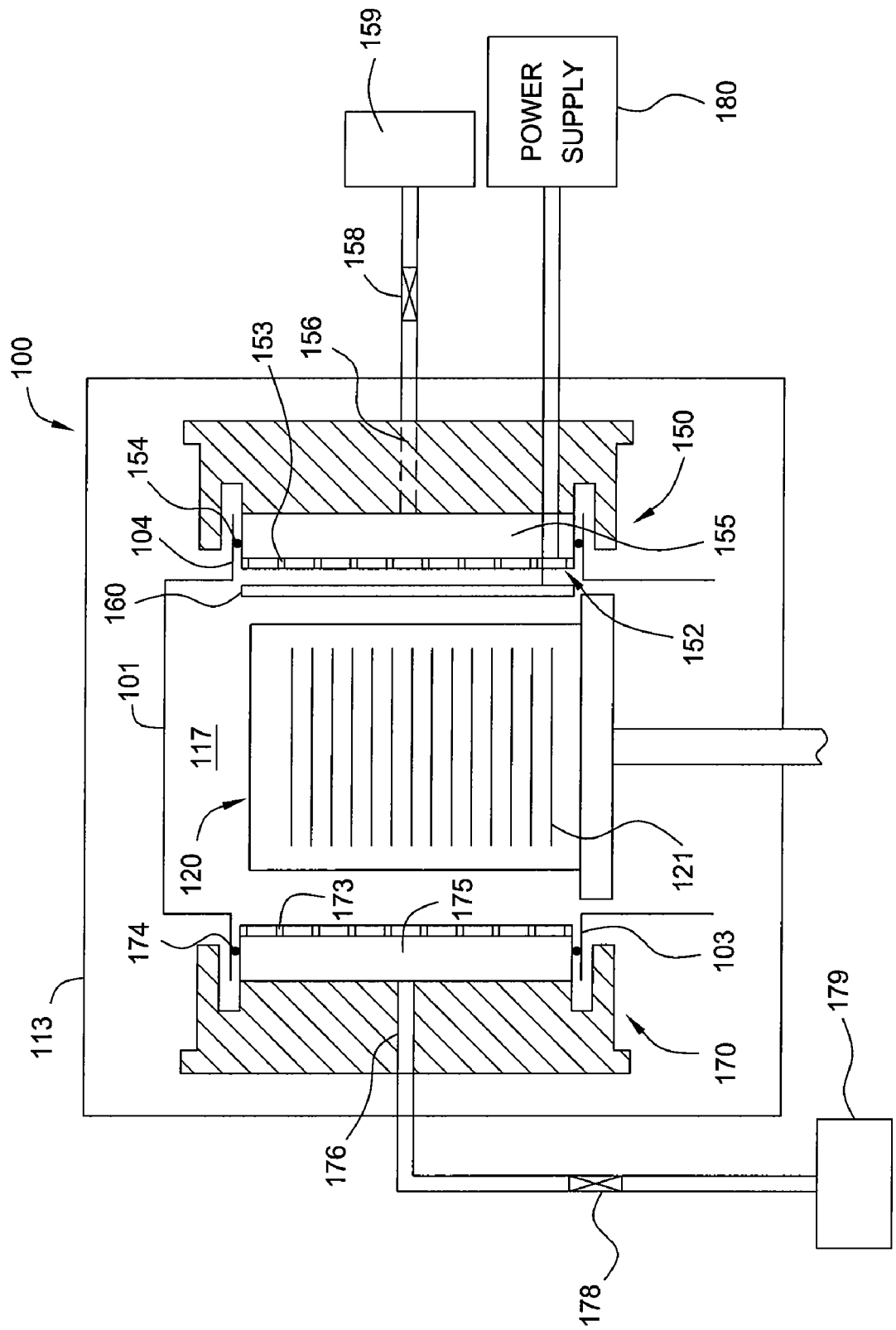
FIG. 1 illustrates a sectional side view of an exemplary batch processing chamber of the invention including an assembly for exciting species of the processing gases.

FIG. 1 illustrates one embodiment of a batch processing chamber having an inner chamber 101 (e.g., a quartz chamber), and controlled inject and exhaust. Typically, the inject assembly 150 and the exhaust assembly 170 are temperature controlled to avoid condensation of processing gases. FIG. 1 is a sectional side view of a batch processing chamber 100. The batch processing chamber 100 generally contains an inner chamber 101 defining a process region 117 configured to accommodate a batch of substrates 121 stacked in a substrate boat 120. The substrates are provided in the process region to be processed by various deposition processes, such as an ALD process or a CVD process. Generally, one or more heater blocks (not shown) are arranged around the inner chamber 101 and are configured to heat the substrates 121 provided in the process region 117. In one embodiment, the inner chamber 101 may for example be a quartz chamber. An outer chamber 113 is generally disposed around the inner chamber 101. One or more thermal insulators (not shown) may be provided between the outer chamber 113 and any heaters in order to keep the outer chamber cool.

Figure 2:
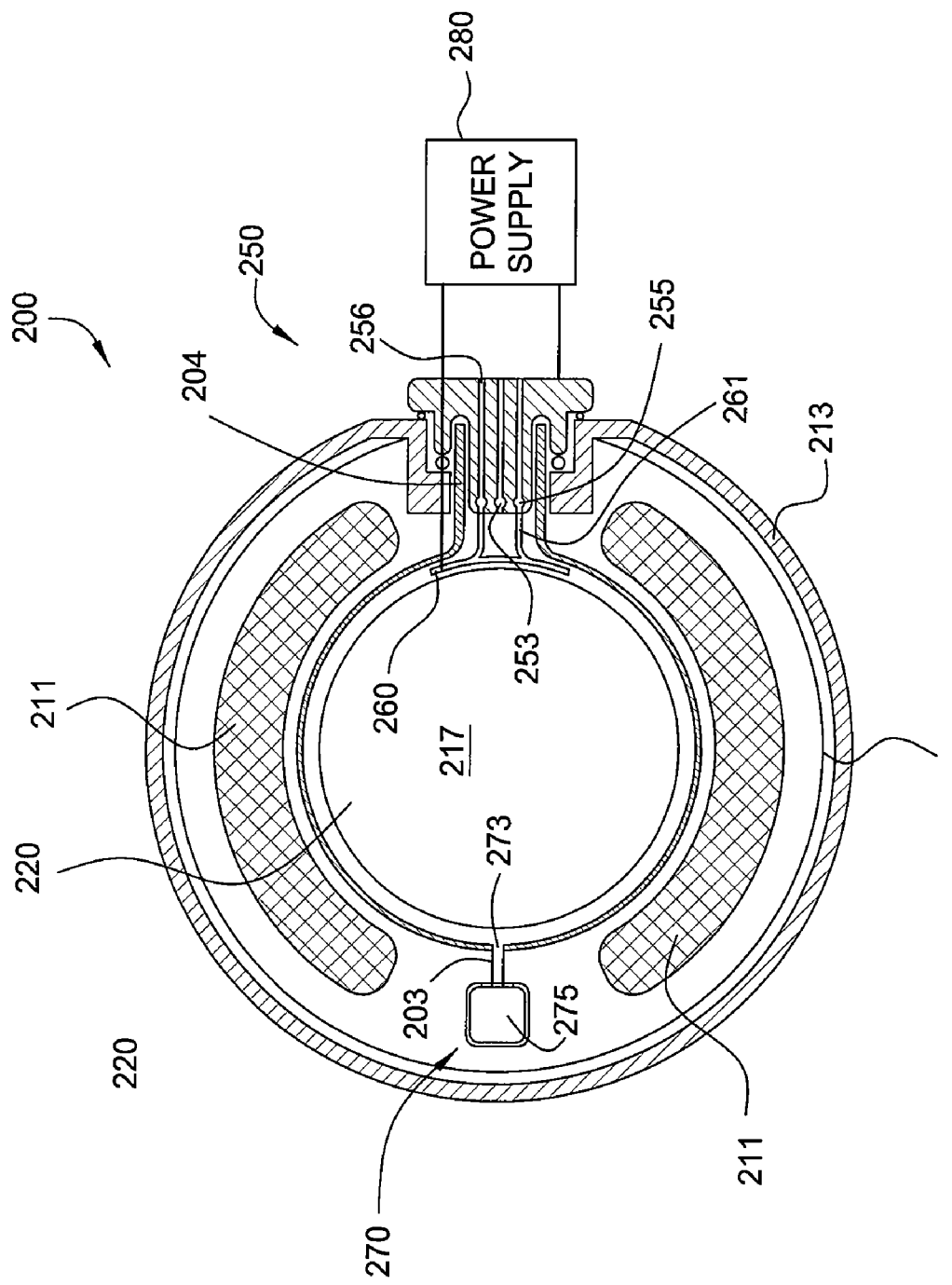
FIG. 2 illustrates a sectional top view of a further embodiment of a batch processing chamber of the invention including an assembly for exciting species of the processing gases.

An example of the heater blocks and the thermal insulators, which may be used in the embodiment shown in FIG. 1, is shown in the embodiment of FIG. 2. FIG. 2, shows one or more heater blocks 211, which are arranged around the inner chamber 201 and are configured to heat the substrates provided in the process region. An outer chamber 213 is generally disposed around the inner chamber 201. In one embodiment, the inner chamber 201 may, for example, be a quartz chamber. In FIG. 2, thermal insulators 212 are be provided between the outer chamber 213 and any heaters in order to keep the outer chamber cool.

FIG. 1 shows the inner chamber 101, e.g., a quartz chamber, generally containing a chamber body having an opening on the bottom, an injector pocket formed on one side of the chamber body, an exhaust pocket formed on the chamber body on an opposite side of the injector pocket. The inner chamber 101 has a cylindrical shape similar to that of the substrate boat 120. Thereby, the process region 117 may be kept small. A reduced process region reduces the amount of processing gas per batch and shortens residence time during batch processing.

In one embodiment, the exhaust pocket 103 and the injector pocket 104 may be welded in place with slots milled on the chamber body of inner chamber 101. According to one embodiment, the injector pocket and the exhaust pocket are flattened quartz tubing with one end welded on the chamber body and one end open. The injector pocket 104 and the exhaust pocket 103 are configured to house injector assembly 150 and exhaust assembly 170. As described in more detail in U.S. Ser. No. 11/249,555, entitled "Reaction Chamber with Opposing Pockets for Gas Injection and Exhaust," filed Oct. 13, 2005, incorporated by reference above, injector assembly 150 and exhaust assembly 170 may typically be temperature controlled. Further, a support plate for supporting the inner (quartz) chamber is further connected to a load lock positioned below the bottom opening of inner chamber 101. The substrate boat 120 may be loaded and unloaded through the load lock. The substrate boat 120 may be vertically translated between the process region 117 and the load lock via the opening at the bottom of the inner chamber.

Examples of substrate boats that may be used in batch processing chambers and during processes described herein are further described in U.S. Ser. No. 11/216,969, entitled "Batch Deposition Tool and Compressed Boat," filed Aug. 31, 2005, which is incorporated herein by reference. Examples of methods and apparatuses for loading and unloading substrate boats used in batch processing is further described in U.S. Ser. No. 11/242,301, entitled "Batch Wafer Handling System," filed Sep. 30, 2005, which is incorporated herein by reference.

The heater blocks are generally wrapped around an outer periphery of the inner chamber 101 except near the injector pocket 104 and the exhaust pocket 103. According to another embodiment (not shown) the heater blocks 211 may also be wrapped around the injector pocket 104 and/or the exhaust pocket 103. The substrates 121 are heated to an appropriate temperature by the heater blocks through the inner chamber 101. The heaters are controlled to achieve uniform heating of the substrates. In one embodiment, points on the substrates 121 in a batch process attain the same set point temperature plus or minus 1 degree Celsius. Configurations of the batch processing chamber 100 improve temperature uniformity in batch processing. For example, a cylindrical shape of the inner chamber 101 results in edges of the substrates 121 evenly distanced from the inner chamber. Also, the heaters may have multiple controllable zones to adjust variations of temperature between regions. The heater blocks may be made of resistive heaters arranged in multiple vertical zones. In one example, the heater blocks may be ceramic resistive heaters.

FIG. 1 illustrates that the injector pocket 104 may be welded on a side of the chamber body defining an inject volume in communication with the process region 117. The inject volume typically extends along the entire height of the substrate boat 120 when the substrate boat is in a process position. The injector assembly 150 disposed in the injector pocket may, thus, provide a horizontal flow of processing gases to every substrate 121.

A recess is formed to hold walls of the injector pocket 104. The injector assembly is thermally isolated, e.g., by seal 154. Seal 154, which may be an o-ring or other suitable elements, also provide a vacuum seal to control the pressure in the inner chamber 101. Thermal isolation of the injector assembly may be desired to independently control the temperature of the injector.

Since the process region 117 and the injector volume are usually kept in a vacuum state during process, an outer volume between inner chamber 101 and chamber 113 may also be evacuated. Keeping the outer volume under a reduced pressure may reduce pressure generated stress on inner chamber 101. Additional vacuum seals, such as o-rings, may be disposed between appropriate parts of chamber 100, in order to control the pressure of the process region 117, the vacuum/pressure stress applied to inner chamber 101, to control gas flow of inserted processing gases only towards the process region. Further, one or more vacuum pumps may be directly or via additional exhaust plenums (not shown) connected to the inner chamber in order to control the pressure in the inner chamber 101.

The temperature of various components in a batch processing chamber may be independently controllable, especially when a deposition process is to be performed in the batch processing chamber. If the temperature of the injector assembly is too low, the gas injected may condense and remain on the surface of the injector assembly, which can generate particles and affect the chamber process. If the temperature of the injector assembly is high enough to evoke gas phase decomposition and/or surface decomposition which may "clog" paths in the injector assembly. An injector assembly of a batch processing chamber is heated to a temperature lower than a decomposition temperature of a gas being injected and higher than a condensation temperature of the gas. The temperature of the injector assembly is generally different than the processing temperature in the process region. In one example, substrates may be heated up to about 600 degrees Celsius, while the temperature of the injector assembly is about 80 degrees Celsius during an atomic layer deposition process. Therefore, the temperature of the injector assembly is controlled independently.

FIG. 1 illustrates that the exhaust pocket 103 may be welded on a side of the chamber body defining an exhaust volume in communication with the process region 117. The exhaust volume typically covers an entire height of the substrate boat 120 when the substrate boat is in a process position such that the exhaust assembly 150 disposed in the exhaust pocket may provide a horizontal flow of processing gases to every substrate 121.

A recess is formed to hold walls of the exhaust pocket 103. The exhaust assembly is thermally isolated, e.g., by seal 174. Seal 174, which may be an o-ring or other suitable elements, also provide a vacuum seal to be able to control the pressure in the inner chamber 101. Thermal isolation of the exhaust assembly may be desired to independently control the temperature of the exhaust.

Since the process region 117 and the exhaust volume are usually kept in a vacuum state during process, an outer volume between inner chamber 101 and chamber 113 may also be evacuated. Keeping the outer volume vacuumed can reduce pressure generated stress on the inner chamber 101. Additional vacuum seals, such as o-rings, may be disposed between appropriate parts of chamber 100, in order to control the pressure of the process region 117, the vacuum/pressure stress applied to inner chamber 101, to control gas flow of inserted processing gases only towards the process region. Further, one or more vacuum pumps may be directly or via additional exhaust plenums (not shown) connected to the inner chamber in order to control the pressure in the inner chamber 101.

Temperature of various components in a batch processing chamber may be controlled independently, especially when a deposition process is to be performed in the batch processing chamber. On the one hand, it is desirable to keep the temperature in the exhaust assembly lower than the temperature in the processing chamber such that the deposition reactions do not occur in the exhaust assembly. On the other hand, it is desirable to heat an exhaust assembly such that processing gases passing the exhaust assembly do not condense and remain on the surface causing particle contamination. If deposition of reaction byproducts on the exhaust assembly does occur, then elevated temperatures on the exhaust assembly may ensure that the deposition has good adhesion. Therefore, the exhaust assembly may be heated independently from the process region.

FIG. 1 illustrates that additionally a gas source 159 is provided. The gas source 159 provides processing gas, like precursor gases or deposition gases, treatment gases, carrier gases, and purge gases via valve 158 and via inlet channel 156 into the vertical channel 155 of the injector assembly. The vertical channel 155 may also be denoted as plenum 155 or cavity 155. The processing gas enters the process region 117 through openings 153 of the injector assembly. The plate and openings form a faceplate 152 to have a uniform distribution of the gas over the substrates 121 in the substrate boat 120.

Generally, carrier gases and purge gases, which may be used as a processing gas, include $N_2$, $H_2$, Ar, He, combinations thereof, and the like. During pretreatment steps $H_2$, $NH_3$, $B_2H_6$, $Si_2H_4$, $SiH_6$, $H_2O$, HF, HCl, $O_2$, $O_3$, $H_2O_2$ or other known gases may be used as a processing gas. In one embodiment, deposition gases or precursor gases may contain a hafnium precursor, a silicon precursor or a combination thereof.

Exemplary hafnium precursors include hafnium compounds containing ligands such as halides, alkylaminos, cyclopentadienyls, alkyls, alkoxides, derivatives thereof or combinations thereof. Hafnium precursors useful for depositing hafnium-containing materials include $HfCl_4$, $(Et_2N)_4Hf$, $(Me_2N)_4Hf$, $(MeEtN)_4Hf$, $(^tBuC_5H_4)_2HfCl_2$, $(C_5H_5)_2HfCl_2$, $(EtC_5H_4)_2HfCl_2$, $(Me_5C_5)_2HfCl_2$, $(Me_5C_5)HfCl_3$, $(^iPrC_5H_4)_2HfCl_2$, $(^iPrC_5H_4)HfCl_3$, $(^tBuC_5H_4)_2HfMe_2$, $(acac)_4Hf$, $(hfac)_4Hf$, $(tfac)_4Hf$, $(thd)_4Hf$, $(NO_3)_4Hf$, $(^tBuO)_4Hf$, $(^iPrO)_4Hf$, $(EtO)_4Hf$, $(MeO)_4Hf$, or derivatives thereof. Exemplary silicon precursors include $SiH_4$, $Si_2H_6$, TDMAS, Tris-DMAS, TEOA, DCS, $Si_2Cl_6$, BTBAS or derivatives thereof.

Alternative metal precursors used during vapor deposition processes described herein include $ZrCl_4$, $Cp_2Zr$, $(Me_2N)_4Zr$, $(Et_2N)_4Zr$, $TaF_5$, $TaCl_5$, $(^tBuO)_5Ta$, $(Me_2N)_5Ta$, $(Et_2N)_5Ta$, $(Me_2N)_3Ta(N^tBu)$, $(Et_2N)_3Ta(NtBu)$, $TiCl_4$, $TiI_4$, $(^iPrO)_4Ti$, $(Me_2N)_4Ti$, $(Et_2N)_4Ti$, $AlCl_3$, $Me_3Al$, $Me_2AlH$, $(AMD)_3La$, $((Me_3Si)(^tBuN))_3La$, $((Me_3Si)_2N)_3La$, $(^tBU_2N)_3La$, $(^iPr_2N)_3La$, derivatives thereof or combinations thereof.

Even though FIG. 1 shows only one gas source, a person skilled in the art will appreciate that a plurality of gas sources, for example, one gas source for a first precursor, one gas source for a second precursor, and one gas source for a carrier and purge gas, may be coupled to the batch processing chamber 100. A gas flow from the different gases may be switched on or off according to the desired needs for a process. Thereby, 3- or 4-way valves may be used to provide the different gases to the inlet channel 156. Alternatively, two, three, or more inlet channels 156 may milled horizontally across the inject assembly 150 and several vertical channels 155 may be provided to insert different processing gases in the process region.

As an example, inject assembly 250 has more than one inlet channel, e.g., three inlet channels 256, as illustrated in FIG. 2. In one embodiment, each of the three inlet channels 256 is configured to supply the process region 117 with a processing gas independently from each other. Each inlet channel 256 is connected to a vertical channel 255. The vertical channels 255 may also be denoted as cavities 255 or plenums 255. The vertical channels 255 are further connected to a plurality of evenly distributed horizontal holes 253 and form a vertical faceplate on the center portion of the inject assembly 250.

On the opposite end of inner chamber 101 from injector assembly 150 an exhaust pocket 103 is provided in chamber 101. Exhaust pocket receives exhaust assembly 170. An exhaust port 176 is formed horizontally across the exhaust assembly 170 near a center portion. The exhaust port 176 opens to a vertical compartment 175 formed in the center portion. The vertical compartment 175 is further connected to a plurality of horizontal slots 173 which are open to the process region 117. When the process region 117 is being pumped out with vacuum pump 179 via valve 178, processing gases first flow from the process region 117 to the vertical compartment 175 through the plurality of horizontal slots 173. The processing gases then flows into an exhaust system via the exhaust port 176. In one aspect, the horizontal slots 173 may vary in size depending on the distance between a specific horizontal slot 173 and the exhaust port 176 to provide an even draw across the substrate boat 120 from top to bottom.

Processing gases such as precursor gases, deposition gases, treatment gases, purge or carrier gases, as described in more detail above, are delivered to and from process region 117 by injector assembly and exhaust assembly. A uniform gas flow across each substrate 121 as well as a uniform gas flow across all substrates vertically aligned in the substrate boat 120 is desired. However, non-uniformity might be caused by irregularities in the gas flow at the wafer edges. These irregularities may be prevented by providing a diffuser 160 between the injector and the substrate boat. The diffuser 160 may prevent the gas flow from direct impact on the edge of the substrate. Diffuser 160 may have a V-shaped form and may direct gas from the inlet tangentially along the substrates.

The diffuser may be provided in various shapes and positions. Generally, the diffuser may be provided between the faceplate of the injector assembly and the substrate boat. Thereby, the diffuser may be integrated in the substrate assembly and/or may be positioned in the injector pocket of the inner chamber 101. Various embodiments of diffusers which may be used in chambers and methods of the application are described in more detail in U.S. patent application, entitled: "Batch Processing Chamber with Diffuser Plate and Injector Assembly", filed on an even dated herewith (U.S. patent application Ser. No. 11/381,966), which is incorporated herein by reference.

The gas flow with improved uniformity carries ionized species of the processing gases, like precursor gases or carrier or purge gases. The uniformity of the gas flow also improves the uniformity of the ionized species, which are used to provide plasma assisted, UV assisted, or ion assisted processes. Generally, the process assistance by plasma, UV, ion generation can be characterized as exciting the introduced gas or by ionizing the introduced gases. The components providing the processing gas flow to the process region 117 are configured to form a uniformly deposited material across each substrate and across the substrates in the substrate boat.

Plasma assisted batch processing has previously been conducted with a remote plasma source. However, a remote plasma is generated at larger distances with regard the process region. Thus, the number of excited species within the plasma has already considerably decreased as the plasma enters the process region. A remote plasma source results in a relaxation of the plasma before the plasma enters the process region.

The invention generally provides an apparatus and a method for processing semiconductor substrates in a batch tool, in which, e.g., the plasma for plasma assisted processing of substrates is provided in the process region or close or adjacent to the process region. Close or adjacent to the process region is to be understood as having the plasma generation directly neighboring the process region, or at least within the inner chamber, the injector pocket, or the injector assembly.

An embodiment illustrated in FIG. 1 includes a power source 180 to generate a plasma, which is connected to the diffuser 160 and the faceplate 152 of the injector assembly 150. A plasma is generated between the diffuser 160 and the faceplate 152 of the injector assembly 150. The injector face is used as an anode and the diffuser is used as a cathode to generate a plasma therebetween. The power applied to generate the plasma can be adapted to the desired application and may depend on the energy necessary to ionize particular species in the processing gas flowing into the process region. As a result, the plasma power may vary depending on the process step presently conducted. For example, for a plasma assisted ALD process, a different power maybe applied during a gas flow of a first precursor, during purging or pumping to remove the first precursor, during gas flow of a second precursor and during purging or pumping to remove the second precursor. Alternatively, some of the process steps may be conducted at similar plasma power or without plasma assistance. For example the purge steps may be conducted with the same power or without power, whereas for the times when precursors are provided to the process region, plasma power adapted for the first and second precursor, respectively, is applied.

As already mentioned above, barrier seal 154 is disposed between the inject pocket 104 and the inject assembly 150, and barrier seal 174 is disposed between the exhaust pocket 103 and the exhaust assembly 170. Thereby, processing chemicals are prevented from entering any undesirable areas in the batch processing chamber. Further, a vacuum seal for the quartz chamber may be provided by seals 154, 174. Additionally, the seals, which may be provided in the form of O-rings or the like, can electrically insulate different components within the chamber from each other. This is of increasing relevance as the power provided by power supply 180 increases. Higher voltages applied to electrodes, e.g., the injector assembly, may require improved electrical insulation of the injector assembly.

Within an embodiment shown in FIG. 1, the plasma may be confined between the face of the injector assembly 150 and the diffuser 160. Thereby, direct exposure of the substrate to a plasma may be avoided. This might be desirable to prevent plasma damage to the surfaces of the substrates. Accordingly, the diffuser shields the substrates from the plasma.

In the embodiments described while making reference to FIG. 1, a plasma is generated in the horizontal direction. The plasma extends along the vertical direction of the diffuser 160 and the injector assembly 150. Thus, the horizontal plasma extends along the vertical direction of the process region 117. The substrates 121 in the substrate boat 120 are exposed to the plasma along the entire stack of substrates. The previously described uniform gas flow provides a uniform distribution of ionized species of the plasma across the wafers.

FIG. 2 illustrates a further embodiment of a batch processing chamber having an inner chamber 201, and controlled inject and exhaust. Typically, the injector assembly 250 and the exhaust assembly 270 are temperature controlled to avoid condensation of processing gases. FIG. 2 is a sectional top view of a batch processing chamber 200. The batch processing chamber 200 generally contains an inner chamber 201 defining a process region 217 configured to accommodate a batch of substrates stacked in a substrate boat 220. The substrates are provided in the process region to be processed by various deposition processes, such as an ALD process or a CVD process. Generally, one or more heater blocks 211, which are arranged around the inner chamber 201 and are configured to heat the substrates provided in the process region. An outer chamber 213 is generally disposed around the inner chamber 201. In FIG. 2, thermal insulators 212 are provided between the outer chamber 213 and any heaters in order to keep the outer chamber cool.

The inner chamber 201, e.g., a quartz chamber, generally comprises a chamber body having an opening on the bottom, an injector pocket formed on one side of the chamber body, an exhaust pocket formed on the chamber body on an opposite side of the injector pocket. The inner chamber 201 has a cylindrical shape similar to that of the substrate boat 220. Thereby, the process region 117 is kept relatively small. A reduced process region reduces the amount of processing gas per batch and shortens residence time during batch processing.

The exhaust pocket 203 and the injector pocket 204 may be welded in place with slots milled on the chamber body. According to an alternative embodiment, the exhaust pocket may be provided in the form of vertically aligned tubes connecting the processing region with the vertical compartment 275. According to one embodiment, the injector pocket 204 and the exhaust pocket 203 are flattened quartz tubing with one end welded on the chamber body and one end open. The injector pocket 204 and the exhaust pocket 203 are configured to house injector assembly 250 and exhaust assembly 270. Injector assembly 250 and exhaust assembly 270 are typically temperature controlled.

An embodiment illustrated in FIG. 2 includes a power source 280 to generate a plasma, which is connected to the diffuser 260 and the faceplate 252 of the injector assembly 250. A plasma is generated between diffuser 260 and the face of the injector assembly. The injector face is used as an anode and the diffuser is used as a cathode to generate a plasma therebetween. The power applied to generate the plasma can be adapted to the desired application and may depend on the energy necessary to ionize particular species in the processing gas flowing into the process region. As a result, the plasma power may vary depending on the process step presently conducted. For example, for a plasma assisted ALD process, a different power maybe applied during a gas flow of a first precursor, during purging or pumping to remove the first precursor, during gas flow of a second precursor and during purging or pumping to remove the second precursor.

Alternatively, some of the process steps may be conducted at similar plasma power or without plasma assistance. For example, the purge steps may be conducted with the same power or without power, whereas plasma power adapted for the first and second precursor, respectively, is applied during the injection of the respective precursor gases.

In one embodiment, as shown in FIG. 2, the plasma may be confined between the face of the injector assembly 250 and the diffuser 260. Thereby, direct exposure of the substrate to a plasma may be avoided. This might be desirable to prevent plasma damage to the surfaces of the substrates. Accordingly, the diffuser shields the substrates from the plasma.

In the embodiments described while making reference to FIG. 2, a plasma in horizontal direction is generated. The plasma extends along the vertical direction of the diffuser and the injector assembly. Thus, the horizontal plasma extends along the vertical direction of the process region 217. The substrates in the substrate boat 220 are exposed to the plasma along the entire stack of substrates. The previously described uniform gas flow provides a uniform distribution of ionized species of the plasma across the wafers.

The batch processing chamber 200 includes an outer chamber 213, heater blocks 211 separated from the outer chamber by thermals insulators 212. An inner chamber 201 including injector pocket 204 and exhaust pocket 203 or exhaust tubes surrounds substrate boat 220 located in the process region. The injector assembly 250 has three inlet channels 256. Processing gas can be provided through the channels to vertical channels 255 and enters the processing location through openings 253 in the face of injector assembly 250. The exhaust assembly 270 includes exhaust port 176, vertical compartment 275 and horizontal slots 273.

Further, a v-shaped diffuser 260 is shown. Similarly to FIG. 1, a power source is coupled via the injector assembly to the injector face and the diffuser to generate a plasma between the injector face and the diffuser. FIG. 2 further illustrates a conductive mesh 261 that further confines the plasma in the gap between the diffuser and the injector face. The diffuser may additionally be made permeable to confine the plasma and to improve protection of the substrates from energetic particles. A permeable diffuser may improve the uniformity of the gas flow across the wafer. In the case of a permeable diffuser, the diffuser may be provided in the form of a mesh. According to another embodiment (not shown), mesh 261 and a permeable mesh diffuser 260 may be provided as one unit to provide a cathode and to confine the plasma between this cathode and the face of the injector assembly acting as the anode. The confinement of plasma—if desired—may be improved by minimizing or omitting a gap between the injector assembly and the mesh or diffuser. Nevertheless, it is to be understood that insulation may be provided in the event neighboring elements form the anode and the cathode for plasma ignition and maintenance.

The conductive and permeable mesh, the diffuser and the face of the injector assembly extend along the direction in which the substrates are stacked over each other in the substrate boat. In the embodiments shown herein, this direction is the vertical direction. The substrates are vertically stacked. As the plasma is generated adjacent to the process region along the entire height of the process region, on the one hand it is possible to provide uniform plasma assisted process conditions in the process region. On the other hand, since the plasma is generated adjacent the process region hardly any relaxation of the excitation occurs until the excited species get in contact with the substrates in the process region.

Figure 3:
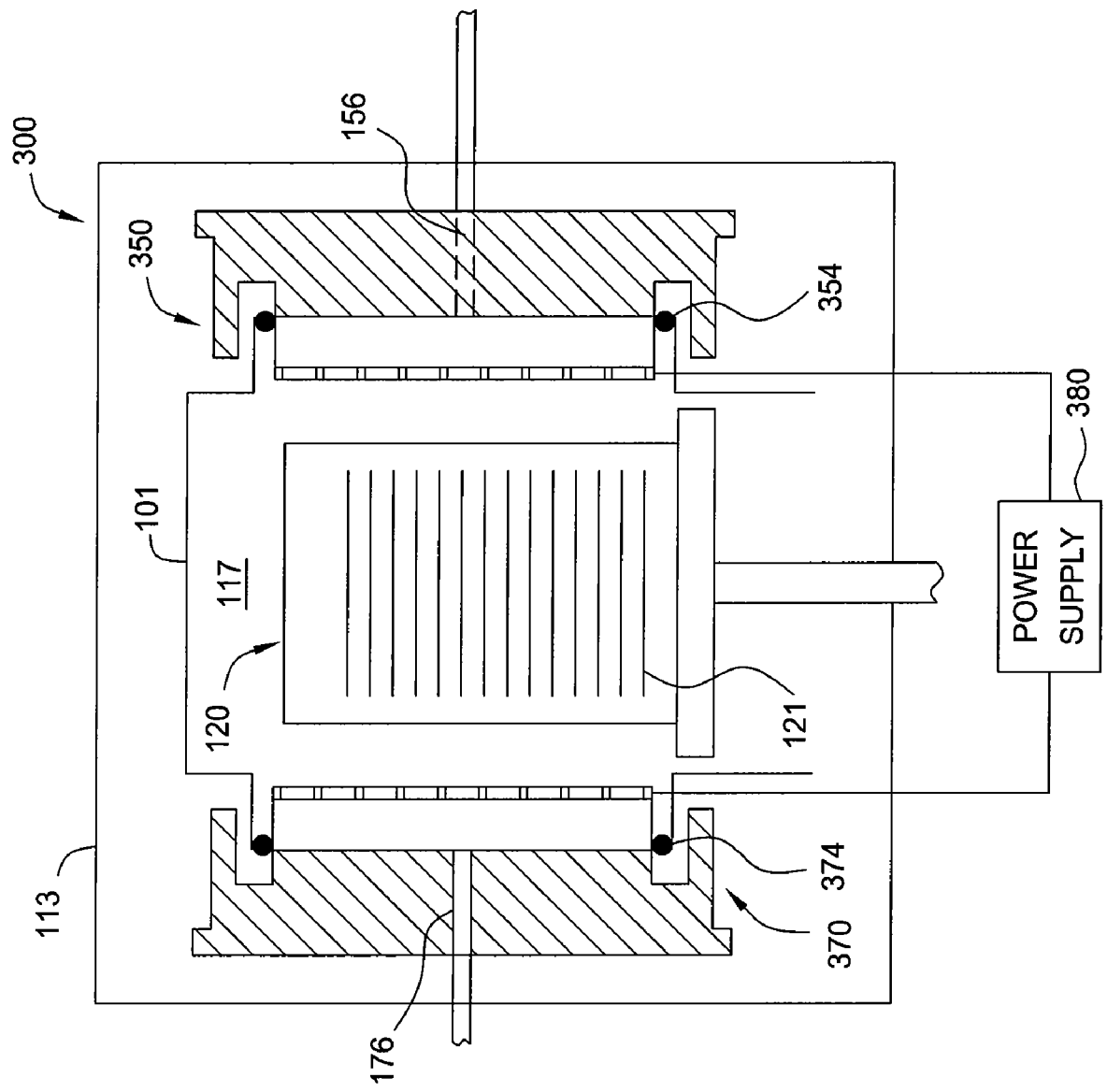
FIG. 3 illustrates a sectional side view of an embodiment of a batch processing chamber of the invention including an assembly for exciting species of the processing gases within a process region.

FIG. 3 illustrates another embodiment of a batch processing chamber 300 wherein plasma assisted ALD processes, plasma assisted CVD processes or other plasma assisted processes may be conducted. Within FIG. 3, elements that are the same in the embodiment of FIG. 1 are denoted with the same reference numbers. Alternatively, these elements may be the same as in the embodiment shown in FIG. 2. A repetition of the description of these elements and the related purposes or usage is omitted for simplicity.

A power supply 380 is connected to the injector assembly 350 and the exhaust assembly 370 in order to generate a plasma between the face of the injector and the opposing port of the exhaust.

The plasma is generated horizontally, that is parallel to the surfaces of the substrates. The plasma extends along the process region 117 of the inner chamber 101. The exhaust port may be used as the cathode and the face of the injector assembly may be used as the anode. In light of the increased distance between the anode and the cathode, the voltage provided by the power supply between the cathode and the anode has to be increased in order to provide the same electrical field acting on the species of the processing gas. As a result of the increased potential difference, the charged components may need further electrical isolation from surrounding components. In FIG. 3, this is indicated by an increased gap between the injector assembly 350 and the injector pocket of the inner chamber 101. Further, the gap of the exhaust assembly 370 is increased. Seals 354 and 374 are also increased in size to indicate the further electrical insulation. Even though, in the case of a quartz chamber, an insulation of the face of the injector assembly and the port of the exhaust assembly may partly be provided by the non-conductive inner chamber, potentials sufficiently high to create a plasma across the process region may need additional insulation of components in the batch processing chamber 300.

Figure 4:
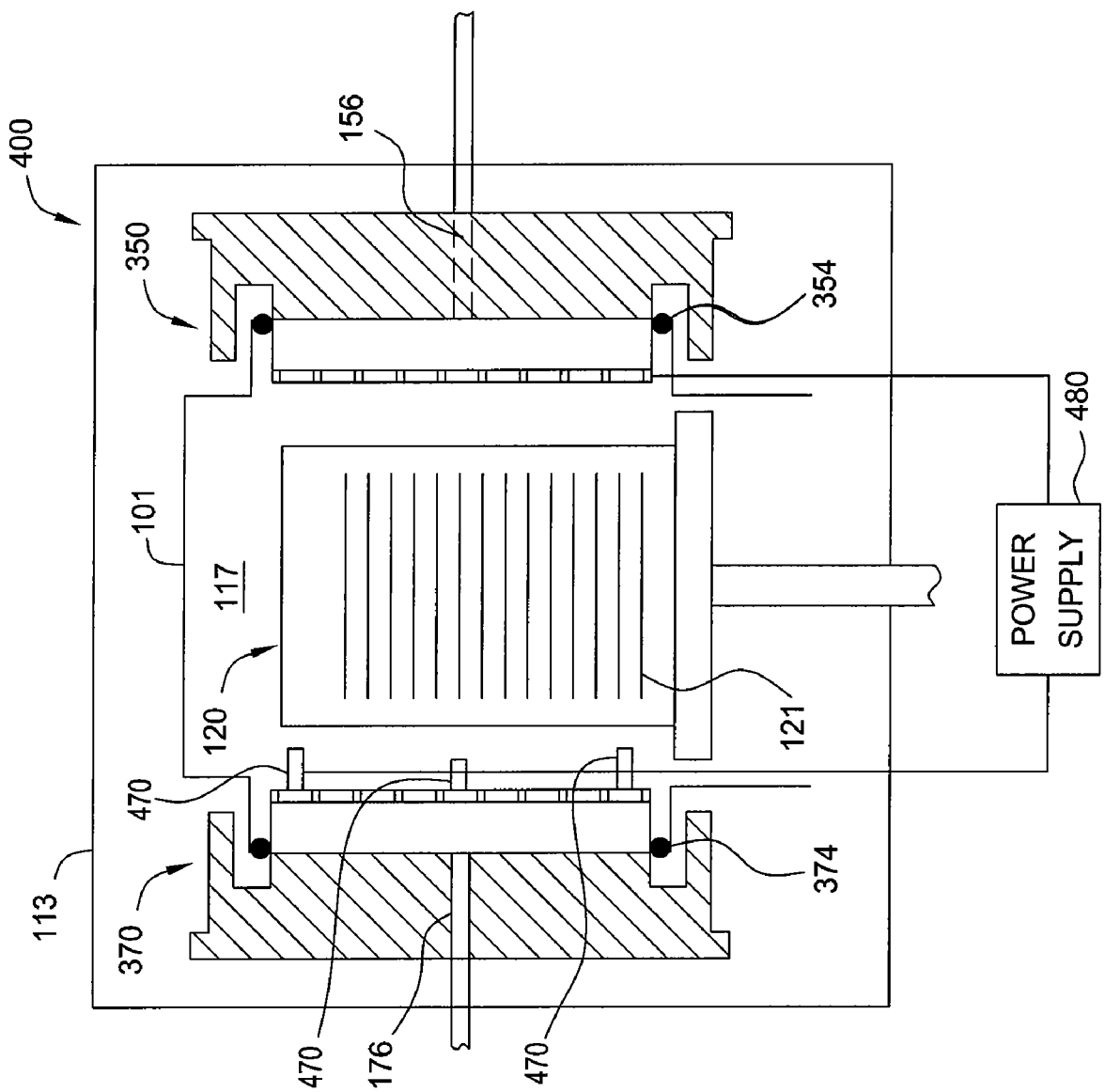
FIG. 4 illustrates a sectional side view of another embodiment of a batch processing chamber of the invention including an assembly for exciting species of the processing gases within a process region.

A further embodiment of a batch processing chamber 400 providing the option of conducting plasma assisted processes is shown in FIG. 4. Within FIG. 4, elements that are the same in the embodiments of FIG. 1 or other previous embodiments are denoted with the same reference numbers. Alternatively, these elements may be the same as in the embodiment shown in FIG. 2. A repetition of the description of these elements and the related purposes or usage is omitted for simplicity.

Within FIG. 4, as compared to chamber 300 of FIG. 3, an electrode 470 is positioned in the inner chamber 101. The electrode 470 or the electrodes 470 may be provided in the form of a rod disposed within the chamber cavity adjacent to the exhaust assembly. Power supply 480 is connected to electrodes 470 and to the injector assembly 350. The faceplate of the injector assembly acts as an electrode. Within the embodiment shown in FIG. 4, a plasma is generated horizontally, parallel to the substrate surfaces of the substrates in the substrate boat. The generated plasma extends across the process region and is exposed to the substrates.

FIG. 4 shows three rods 470 as electrodes for plasma generation. Alternatively, one or two vertical rods may also be used as electrodes. Further, 4 or more rods may be used as electrodes. The number and the arrangement of electrodes should be adapted to provide a uniform plasma across the substrates and to not disturb the uniformity of the gas flow of the processing gases.

According to another embodiment (not shown), the rods may also be positioned between the face of the injector assembly and the substrate boat. Thereby, a plasma generation comparable to FIG. 1 may occur. The plasma is generated adjacent the substrate boat within inner chamber 101, e.g., a quartz chamber. The plasma is generated horizontally between the vertically extending face of the injector assembly and the vertically extending set of rods. Thereby, a direct exposure of the substrates to the plasma may be reduced. However, the species of the processing gas, which have been excited by the plasma, have little time to relax before getting in contact with the substrate surface. As a further alternative (not shown), electrodes may also be disposed at other locations in the inner chamber 101.

Figure 5:
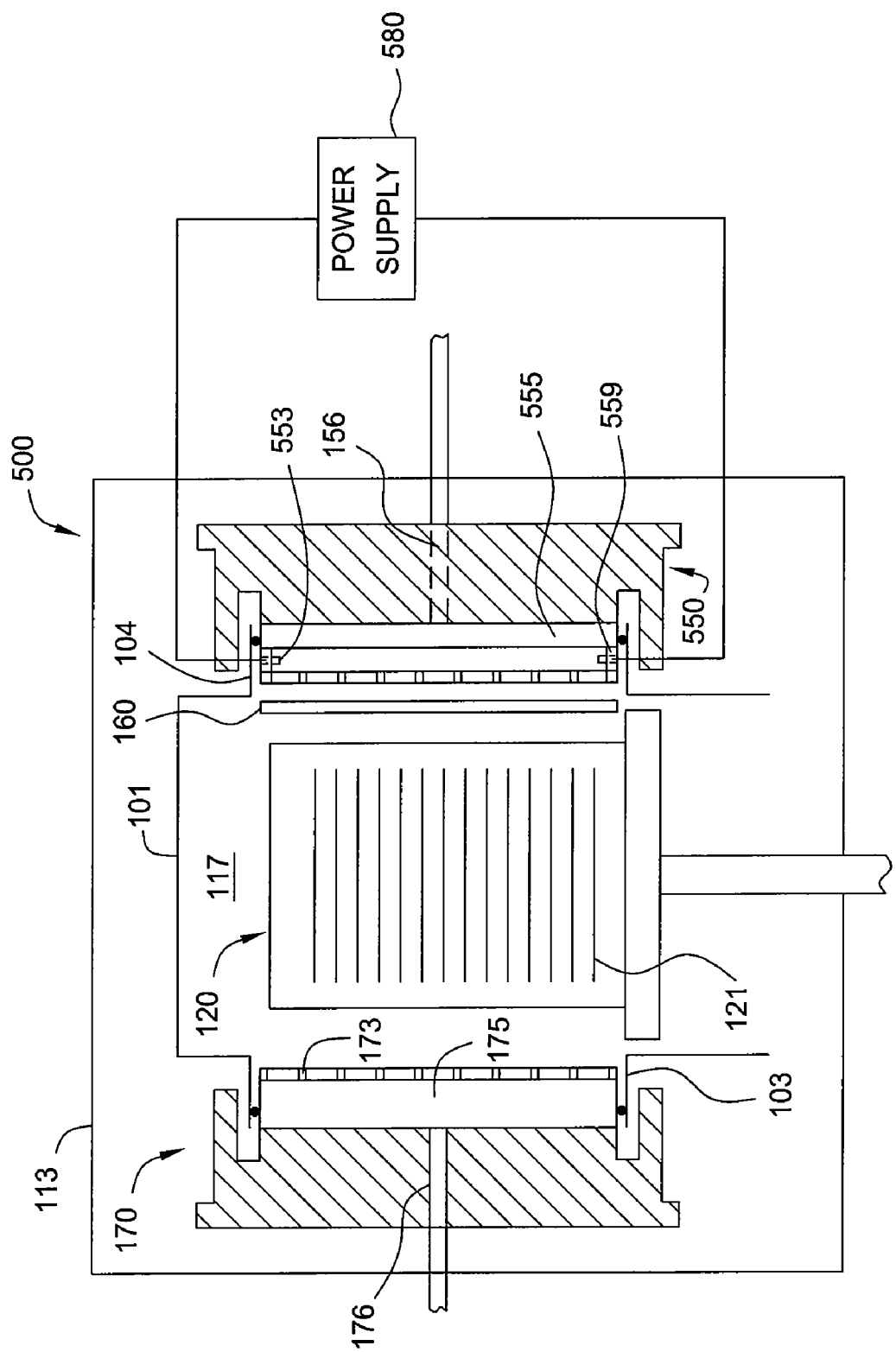
FIG. 5 illustrates a sectional side view of an exemplary batch processing chamber of the invention including an assembly for exciting species of the processing gases within an injector assembly.
Figure 6:
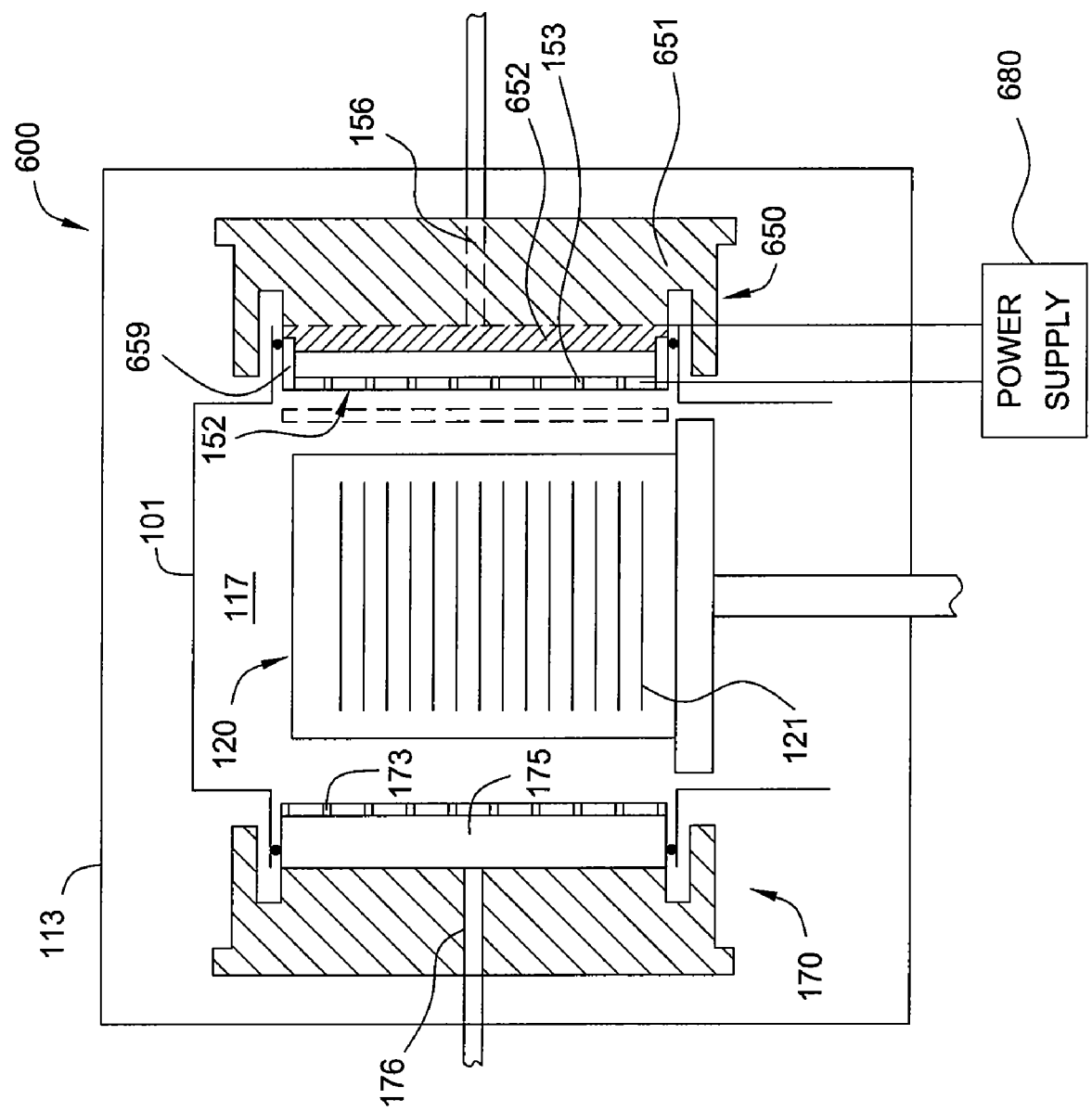
FIG. 6 illustrates a sectional side view of another embodiment of an exemplary batch processing chamber of the invention including an assembly for exciting species of the processing gases within an injector assembly.

FIGS. 5 and 6 illustrate further embodiments. Elements that are the same in the embodiments of FIG. 1 or other previous embodiments are denoted with the same reference numbers. Alternatively, these elements may be the same as in the embodiment shown in FIG. 2. A repetition of the description of these elements and the related purposes or usage is omitted for simplicity.

For the embodiments of FIGS. 5 and 6, the plasma may be generated in the injector assembly. In one embodiment, the plasma may be generated in the vertical channel inside the injector assembly. Also, the vertical channel may be denoted as plenum or cavity.

FIG. 5 shows a batch processing chamber. The injector assembly 550 includes vertical rods 553 insulated from each other by insulator parts 559. Alternatively, the injector 550 may be formed of an insulating material. A plasma power source 580 is connected to the top rod 553 and the bottom rod 553. According to one embodiment the top rod may be the cathode and the bottom rod may be the cathode, whereas to another embodiment the top rod may be the cathode whereas the bottom rod is the anode. The rods form electrodes for generation of a plasma. The generated plasma is confined in the vertically extending channels 555. The plasma is generated vertically and the excited species of the processing gas enter the process region horizontally through the openings in the faceplate of the injector assembly.

According to an alternative embodiment, the faceplate of the injector may be made of a conductive material to improve confinement of the plasma within the vertical channel. The embodiments described with respect to FIG. 5, may optionally include a diffuser 160 as shown in FIG. 5 and described in more detail with respect to FIGS. 1 and 2.

The embodiment shown in FIG. 6 also includes plasma generating elements that provide a plasma in the vertical channel of the injector assembly 650. The plasma is generated between the walls of the vertical channel. One wall is the faceplate 152 including the openings 153. The other wall is electrode 652 is provided in the body 651 of injector assembly 650. Electrode 652 forms the wall of the vertical channel opposing the faceplate 152. The two electrodes connected to the power supply 680 are separated by insulator element 659.

According to an alternative embodiment (not shown), the body 651 of the injector assembly may form one of the electrodes to generate the plasma. The injector is formed of a conductive material and no separate electrode 652 may be required. According to this embodiment, the faceplate forming the opposing electrode would also be connected to the body 651 by insulating elements 659. The embodiments described with respect to FIG. 6, may optionally include a diffuser 160 as shown in FIG. 5 and described in more detail with respect to FIGS. 1 and 2.

Embodiments described herein with respect to FIGS. 1 to 6 illustrate batch processing chambers which may be used during plasma assisted processes, e.g., ALD or CVD processes. Therein, the plasma assistance provides ionized species of the processing gases within the chamber and in or in the vicinity of the process region. The presence of the plasma in the process region or in the vicinity of the process region reduces relaxation of the excited states. Since the plasma assistance provides ionized species of the processing gases to the substrate surfaces, a plasma assisted process can be considered one form of process based on excited species of the processing gases.

In the following, another form of processes with assistance of exciting species and respective embodiments of chambers will be described. The processes, such as ALD processes or CVD processes, are assisted by UV radiation. The UV light may be used to excite and/or ionize species of the processing gases or, e.g., to maintain the $O_3$ concentration at a desired level. In light of the excitation of species of processing gases, i.e., the electrons are excited to higher excitation levels, UV assistance during batch processing may also be considered one form of process that is assisted by excited species.

On irradiation of the processing gases with UV light, species of the processing gases are excited above ground state. The excitation depends on the wavelength of the UV light. The wavelength may be in the range of 126 nm to 400 nm. The excited species assist ALD or CVD processes by initiating or enhancing surface reactions of the precursors or reactance. The enhancement may result in reduction of exposure time and, thus, increase throughput. Additionally, film quality may improve because of more complete reactions of the precursors.

For UV assisted film growth processes, the relaxation time of the excited species may be in a range that by the time the processing gas reaches the process region a remotely excited processing gas has relaxed. For example, the $O_3$ concentration might decrease by the time it reaches the process region of the deposition chamber if excited at a remote location. The $O_3$ concentration may be maintained higher by activating $O_3$ inside the chamber.

Figure 7:
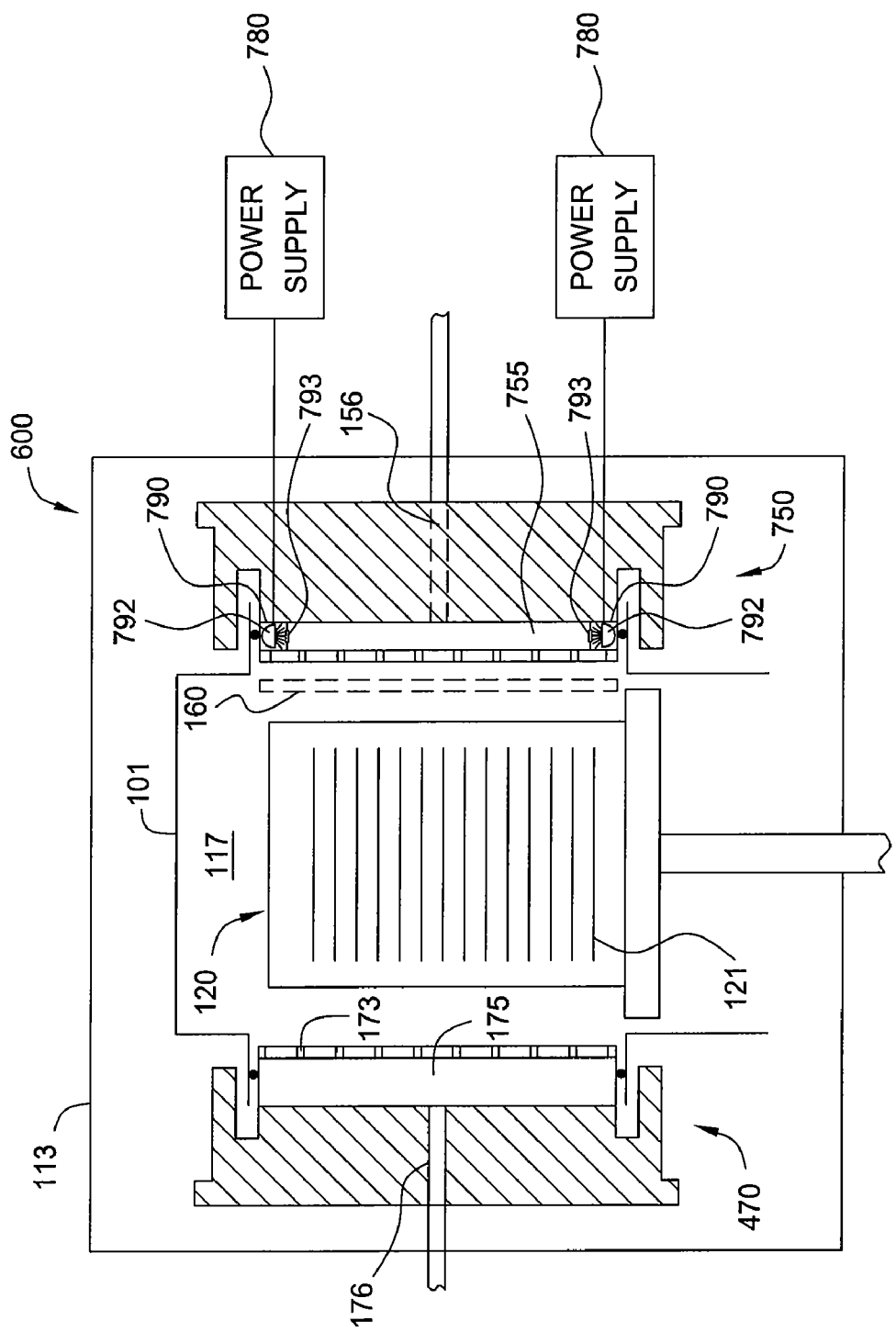
FIG. 7 illustrates a sectional side view of an even further embodiment of an exemplary batch processing chamber of the invention including an assembly for exciting species of the processing gases within an injector assembly.

An embodiment of a batch processing chamber 700 with UV assistance is shown in FIG. 7. Within FIG. 7, elements that are the same in the embodiments of FIG. 1 or other previous embodiments are denoted with the same reference numbers. Alternatively, these elements may be the same as in the embodiment shown in FIG. 2. A repetition of the description of these elements and the related purposes or usage is omitted for simplicity.

FIG. 7 illustrates an embodiment for irradiating UV light vertically inside the vertical channel 755 of the injector assembly 750. A UV source 790 is provided at the upper end of the vertical channel 755 and a UV source is provided at the lower end of the vertical channel. Each source includes a lamp 792 and a window 793 facing the vertical channel. The window material can be chosen depending from the UV wavelength. For example a quartz window may be used for wavelength up to about 180 nm to 220 nm. Sapphire., magnesium fluoride or calcium fluoride windows may be used as window 793 in the event of shorter wavelengths.

The UV light extends vertically along the vertical channel 755 and excites species of the processing gases in the injector assembly before entering the process region. Within the embodiment shown in FIG. 7, UV lamps like deuterium lamps or arc lamps filled with Hg or Xe, may be used. The species of the processing gas excited in the vertical channel are provided uniformly with the uniform gas flow generated by the injector assembly, the exhaust assembly and optionally be the diffuser, the gas flow being described in more detail with respect to FIG. 1.

Figure 8:
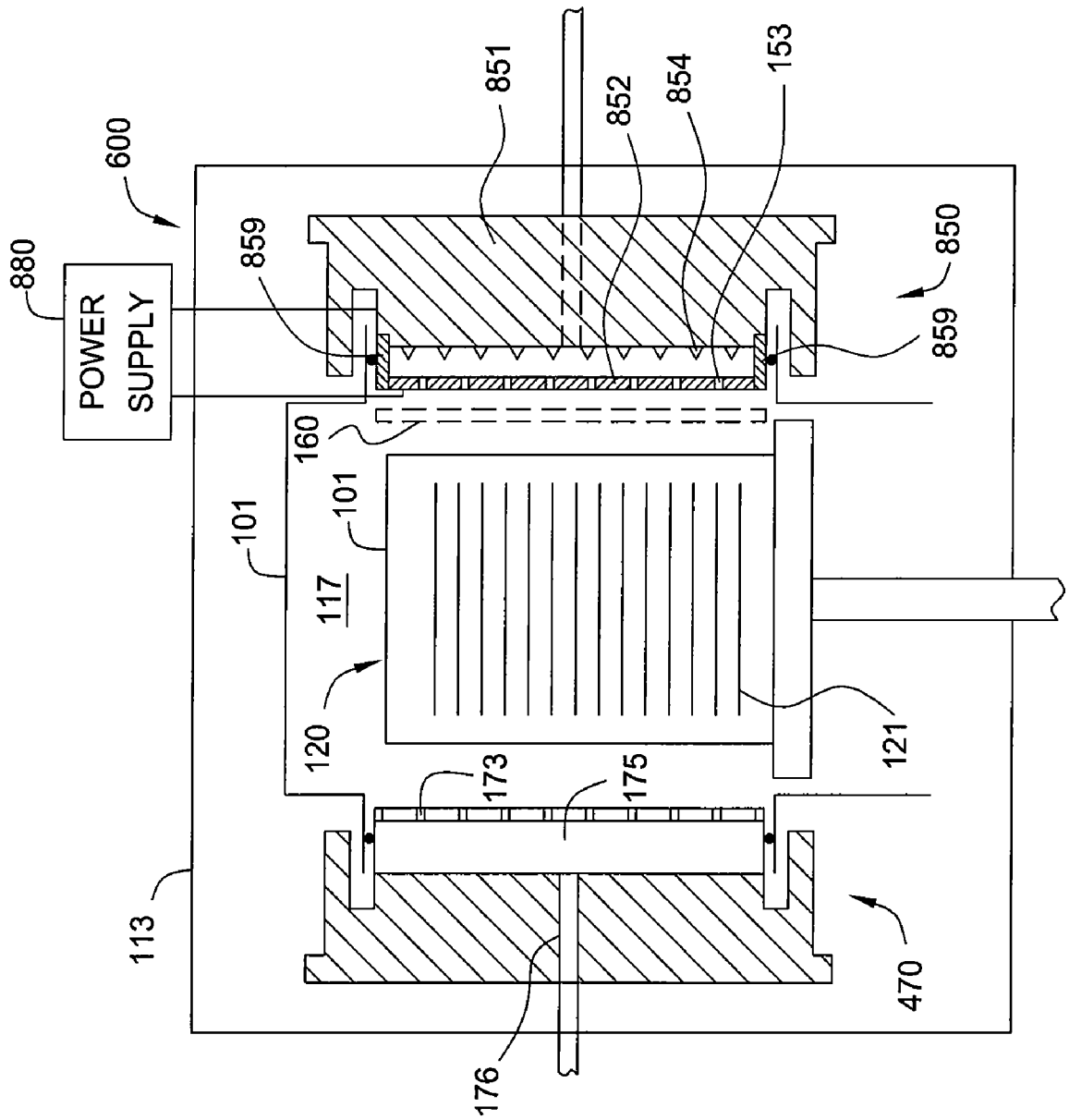
FIG. 8 illustrates a sectional side view of another embodiment of an exemplary batch processing chamber of the invention including an assembly for exciting species of the processing gases within an injector assembly.

FIG. 8 shows another embodiment of batch processing chamber 800 with an injector assembly 850. The embodiment may be used for UV assisted processes. Within FIG. 8, elements that are the same in the embodiments of FIG. 1 or other previous embodiments are denoted with the same reference numbers. Alternatively, these elements may be the same as in the embodiment shown in FIG. 2. A repetition of the description of these elements and the related purposes or usage is omitted for simplicity.

FIG. 8 illustrates that the injector assembly shines UV light through openings 153 of the faceplate horizontally and parallel to substrate surfaces of substrates stacked in a substrate boat. The UV light is generated in the vertical channel 855 by striking a glow discharge with a noble gas in vertical channel 855. The injector face 852 of the faceplate is configured as an anode. The body 851 of the injector is electrically insulated by insulators 859 from the anode. The vertical channel 855 functions as a hollow cathode.

As described with previously with respect to FIG. 2, the injector assembly may have a plurality of vertical channels. A single one of the vertical channels or a plurality of vertical channels may be used as a hollow cathode to provide UV light inside the chamber.

In the event the electrical field in the injector may be too small to strike a glow discharge, tips 854 can be mounted in the injector. Thereby, the electrical field strength near the tips is increased and the glow discharge can be ignited with smaller voltages applied. According to another embodiment (not shown) the tips 854 may be omitted if sufficient power is provided by power source 880 to strike the glow discharge in the vertical channel.

Figure 9:
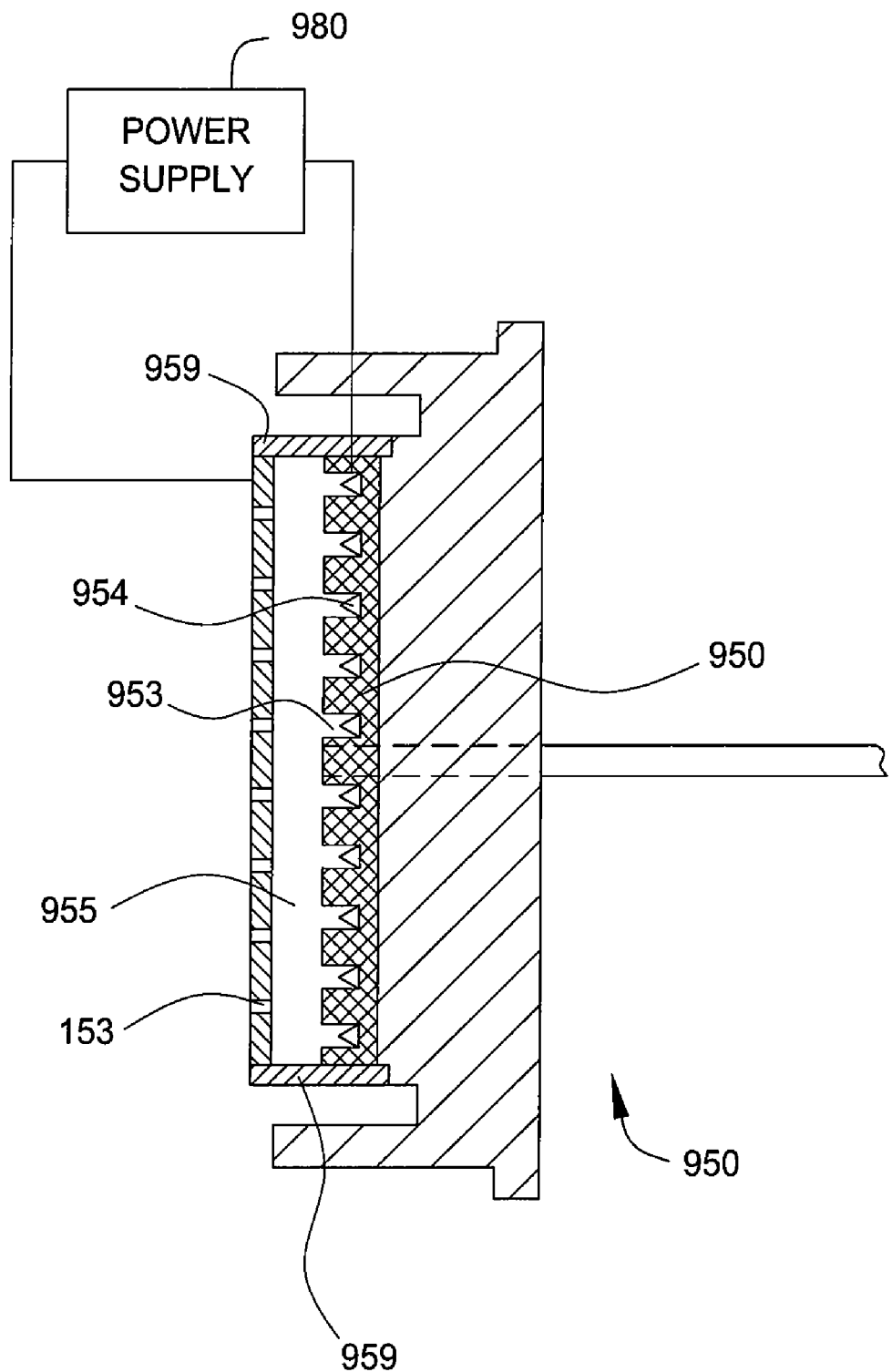
FIG. 9 illustrates a sectional side view of another embodiment of an injector assembly for a batch processing chamber of the invention including an assembly for exciting species of the processing gases within an injector assembly.

FIG. 9 shows another embodiment of an injector assembly. As compared to the embodiment shown in FIG. 8, a separate conductive element 950 is provided at the rear end of the vertical channel as the cathode. The cathode 950 is provided with a plurality of small cavities. These cavities are in the form of cylinders with a small diameter in the range of 1 mm to 12 mm, are provided as an array of additional hollow cathodes. Thereby, the hollow cathode effect providing the UV light with a wavelength corresponding to the gas in the vertical channel and/or the cathode material can be multiplied. As a result, the photon density in the vertical channel and in the process region wherein the substrates are processed can be increased. Alignment between hollow cathodes and the faceplate holes ensures that transmission into the process region is optimized.

Tips 954 may be provided in the hollow cathodes. The tips may be used to increase the electrical field strength due to the small curvature of the tip and improve striking of a glow discharged at lower voltage levels.

According to another embodiment (not shown) a glow discharge may also be generated between the diffuser and the face of the injector, that is one side of the faceplate. Thereby, the diffuser is provided as the anode and the face of the injector is the cathode.

For all embodiments where the glow discharge is contained in a plenum of the injector for UV production, differential pumping may used (not shown). In some instances, the process pressure at the substrates may be lower than the pressure required by the glow discharge used for UV production. In this case, gas used for glow discharge may be diverted from the process chamber.

For all embodiments where the glow discharge is contained in a plenum of the injector for UV production, an UV transparent membrane may be fastened to the reactor side of the injector faceplate (not shown.) In some instances, the process pressure at the substrates may be higher than the pressure required by the glow discharge used for UV production. In this case, gas from the process is isolated from the gas used for glow discharge by a barrier. Since the barrier is UV transparent, UV is transmitted to the substrates. The barrier is thin to optimize UV transmission, but thick enough to support a process pressure of up to about 10 Torr.

Generally, for the UV assisted batch processing chambers, the wavelength of the UV radiation, that is the photon energy, may be selected based on the gases used in the hollow cathode. Typical noble gases and their irradiated photon energy based on recombination of the excited states are He (for example, 21.22 eV, 40.82 eV, 40.38 eV), Ne (for example, 16.85 eV, 16.67 eV, 26.9 eV) or Ar (for example, 11.83 eV, 11.63 eV, 13.48 eV, 13.30 eV). Broad spectrum UV from deuterium lamps, or other UV sources (for example a mercury lamp), as well as softer UV radiation is also applicable.

Further, for UV assisted batch processing chambers, a susceptor for carrying the substrates formed of silicon carbide (SiC) may be adapted to reflect the UV light. The susceptor profile and the roughness may be adapted to reflectively focus the UV light on the substrate surfaces. Thereby, a location of excitation of processing gas species by UV radiation may be even closer to the substrate surfaces. The cylindrical geometry of the inner chamber 101 favors glancing angles for which UV reflectivity is enhanced relative to normal incidence. With a glow discharge in the injector vertical channel, UV assisting may be provided during any process step having appropriate conditions for the glow discharge. As mentioned above, conditions in the plenum of the injector and the processing region may vary if a gas diversion, a barrier or other measures are provided. Thereby, conditions appropriate for glow discharge may be provided in the parts of the chamber. Appropriate process conditions may include the injection of a gas desired for the glow discharge. For 11.63 eV and 11.83 eV photons from Ar, an optimal pressure of the glow discharge is 0.45 Torr, and the reflectivity for SiC is 0.4 at normal incidence and at $\pi/4$ incidence.

For CVD processes that require UV assistance, the expected duty cycle is continuous. For ALD processes, there are several instances for which UV assistance may be required for film properties and/or for throughput. UV assistance may be required for one or all precursor exposures where the photon energy may be required to start the reaction between precursor molecule and surface binding site. UV assistance may be required during the cycle-purging steps at the end of an ALD cycle to complete the surface reaction such that incorporation of reaction byproducts is minimized.

In the following, further embodiments will be described while making reference to FIGS. 8 and 9. As described above, UV assisted processes can be provided with a vertically extending anode and a vertically extending hollow cathode, wherein the anode and the cathode is arranged such that the anode is closer to the substrate boat holding the wafer stack.

The embodiments described above with respect to the plasma assisted processes and the hollow cathode effect may also be utilized for ion assisted ALD or CVD batch processing chambers. Therefore, according to one embodiment, a diffuser would be the cathode and the injector face would be the anode. According to another embodiment, the injector face side of the vertical channel (faceplate side of the vertical channel) would be the cathode and the opposing side of the injector located towards the body of the injector assembly would be the anode. Generally, the power supply is connected to the respective components of the previous embodiments with a polarization, such that ions are provided to the processing region. In light of the ionization of species of processing gases, ion generating assistance during batch processing may also be considered one form of process assisted by excited species. Further, the diffuser may be modified to provide a hollow cathode effect.

Ions generated in the glow discharge are then accelerated towards the process region. Ions and neutrals may pass the cathode through openings provided therein. Thus, the ions and neutrals enter the process region and can assisted processes by the energy or the momentum of the ions. The kinetic energy of the ions and neutrals may be about 600 eV. Optionally retarding grids may be used to reduce the ion energy. A retarding grid may be provided in form of a mesh with a potential applied thereto. The potential decelerates the ions. The decelerated ions may pass through openings in the grid. A charged grid mounted between the injector and the wafer boat can, thus, reduce the energy and the momentum to a desired level.

For the embodiments relating to plasma assisted processes, UV assisted processes or ion assisted processes, the electrode formed by the elements of the injector and the exhaust may be grounded, whereas the other electrode is biased. Elements of the injector or exhaust assembly may be an anode or a cathode for plasma generation, UV generation or ion generation. Generally, it is to be understood that either one of the anode or the cathode may be grounded.

While the foregoing is directed to embodiments of the invention, other and further embodiments of the invention may be devised without departing from the basic scope thereof, and the scope thereof is determined by the claims that follow.

The invention claimed is:

1. A batch chamber for processing a plurality of substrates, comprising:
   a chamber housing containing a process region;
   a substrate boat in the process region for holding a batch of substrates vertically stacked; and
   an excitation assembly for exciting species of a processing gas introduced in the process region, and positioned within the chamber housing, wherein the excitation assembly comprises an anode unit and a cathode unit wherein at least one of the cathode unit or anode unit configured to diffuse the processing gas introduced in the process region and wherein at least one of the anode unit or the cathode unit extends along the vertical direction of the substrate boat.

2. The chamber of claim 1, further comprising an inner chamber containing the process region, wherein the excitation assembly is positioned in the inner chamber.

3. The chamber of claim 1, wherein the excitation assembly is positioned adjacent to the process region.

4. The chamber of claim 1, further comprising an injector assembly for introducing the processing gas into the process region, and wherein the excitation assembly is positioned in the injector assembly.

5. The chamber of claim 1, further comprising an injector assembly and an exhaust assembly for the processing gas, wherein the excitation assembly is configured to excite the species of the processing gas between the injector assembly and the exhaust assembly.

6. The chamber of claim 1, wherein the anode unit and the cathode unit are adapted to provide excited species along the vertical direction of the substrate boat.

7. The chamber of claim 6, wherein the anode unit extends substantially vertically along the process region and the cathode unit extends substantially vertically along the process region.

8. The chamber of claim 1, wherein the cathode unit is displaced horizontally with respect to the anode unit.

9. The chamber of claim 1, wherein the excitation assembly is a plasma source.

10. The chamber of claim 1, wherein the excitation assembly further comprising a UV source.

11. The chamber of claim 10, wherein the UV source is a hollow cathode glow charge UV source.

12. The chamber of claim 1, wherein the excitation assembly further comprising an ion source.

13. The chamber of claim 1, further comprising an injector assembly for introducing the processing gas into the process region, wherein the anode unit is a faceplate of the injector assembly.

14. The chamber of claim 1, further comprising an injector assembly for injecting processing gas into the process region wherein the cathode unit is a faceplate of the injector assembly.

15. The chamber of claim 1, further comprising an injector assembly for the processing gas, wherein the injector assembly and the diffuser are positioned to confine a plasma there between.

16. The chamber of claim 1, further comprising an injector assembly for the processing gas, wherein the cathode unit is a mesh disposed between the injector assembly and the substrate boat.

17. The chamber of claim 16, wherein the injector assembly and the mesh are positioned to confine a plasma therebetween.

18. The chamber of claim 1, wherein the cathode unit is a rod assembly.

19. The chamber of claim 1, wherein the cathode unit is an exhaust assembly for the processing gas.

20. A batch chamber for processing a plurality of substrates, comprising:
   a chamber housing containing a process region;
   an injector assembly within the chamber housing for injecting a processing gas into the process region and having an inlet channel and a faceplate;
   a substrate boat in the process region for holding a batch of substrates; and
   an excitation assembly for exciting species of the processing gas, and positioned in the injector assembly, wherein the faceplate is configured as an anode unit or a cathode unit of the excitation assembly; and wherein the faceplate extends along the vertical direction of the substrate boat.

21. The chamber of claim 20, wherein the excitation assembly is positioned adjacent to the process region.

22. The chamber of claim 20, wherein the excitation assembly comprises an anode unit and a cathode unit adapted to provide the excited species along the vertical direction of the substrate boat.

23. The chamber of claim 22, wherein the anode unit extends substantially vertically along the process region and the cathode unit extends substantially vertically along the process region.

24. The chamber of claim 20, wherein the substrate boat is configured to hold the wafers in a vertically stacked manner within the process region and the excitation assembly comprises an anode unit and a cathode unit displaced horizontally with respect to the anode unit.

25. The chamber of claim 20, wherein the substrate boat is configured to stack the wafers vertically; and
   wherein the excitation assembly comprises an anode unit and a cathode unit displaced vertically with respect to the anode unit.

26. The chamber of claim 20, wherein the excitation assembly is a plasma source.

27. The chamber of claim 26, wherein the plasma source comprises electrodes positioned in a cavity of the injector assembly.

28. The chamber of claim 20, wherein the excitation assembly further comprising a UV source.

29. The chamber of claim 28, wherein the UV source is a hollow cathode glow charge UV source.

30. The chamber of claim 28, wherein the UV source comprises at least two UV lamps.

31. The chamber of claim 30, wherein the UV lamps are positioned in a cavity of the injector assembly.

32. The chamber of claim 1, wherein the excitation assembly further comprising an ion source.

* * * * *

UNITED STATES PATENT AND TRADEMARK OFFICE
CERTIFICATE OF CORRECTION

PATENT NO.        : 7,798,096 B2
APPLICATION NO.   : 11/381970
DATED             : September 21, 2010
INVENTOR(S)       : Mahajani et al.

It is certified that error appears in the above-identified patent and that said Letters Patent is hereby corrected as shown below:

In the Detailed Description:

Column 6, Line 56, please delete "$(Et_2N)_3Ta(NtBu)$" and insert --$(Et_2N)_3Ta(N^tBu)$-- therefor.

Signed and Sealed this
First Day of March, 2011

David J. Kappos
*Director of the United States Patent and Trademark Office*